United States Patent
Imamura et al.

(10) Patent No.: US 10,950,474 B2
(45) Date of Patent: Mar. 16, 2021

(54) LASER IRRADIATION APPARATUS, LASER IRRADIATION METHOD, AND METHOD FOR MANUFACTURING SEMICONDUCTOR DEVICE

(71) Applicant: THE JAPAN STEEL WORKS, LTD., Tokyo (JP)

(72) Inventors: Hiroaki Imamura, Yokohama (JP); Takahiro Fuji, Yokohama (JP); Yoshihiro Yamaguchi, Yokohama (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 0 days.

(21) Appl. No.: 16/485,419

(22) PCT Filed: Aug. 18, 2017

(86) PCT No.: PCT/JP2017/029617
§ 371 (c)(1),
(2) Date: Aug. 12, 2019

(87) PCT Pub. No.: WO2018/168002
PCT Pub. Date: Sep. 20, 2018

(65) Prior Publication Data
US 2020/0006096 A1   Jan. 2, 2020

(30) Foreign Application Priority Data
Mar. 16, 2017   (JP) .............................. JP2017-050811

(51) Int. Cl.
*H01L 21/683*   (2006.01)
*H01L 21/67*   (2006.01)
*H01L 21/02*   (2006.01)

(52) U.S. Cl.
CPC .. *H01L 21/67115* (2013.01); *H01L 21/02592* (2013.01); *H01L 21/02675* (2013.01); *H01L 21/6838* (2013.01)

(58) Field of Classification Search
CPC ........... H01L 21/67115; H01L 21/6838; H01L 21/02675; H01L 21/02592; H01L 21/268;
(Continued)

(56) References Cited

U.S. PATENT DOCUMENTS 6,514,339 B1 *   2/2003   Jung ....................... C30B 13/24
117/107
2003/0008602 A1 *   1/2003   Ashjaee ............ H01L 21/67126
451/54
(Continued)

FOREIGN PATENT DOCUMENTS

CN   1646400 A   7/2005
CN   102005402 A   4/2011
(Continued)

OTHER PUBLICATIONS

International Search Report from International Patent Application No. PCT/JP2017/029617, dated Oct. 3, 2017.
(Continued)

*Primary Examiner* — Caridad Everhart
(74) *Attorney, Agent, or Firm* — SGPatents PLLC

(57) ABSTRACT

A laser irradiation apparatus includes a laser generation device, a levitation unit to levitate an object to which the laser light is applied, and a conveyance unit to convey the levitated object. The conveyance unit includes a holding mechanism for holding the object by absorption, and a moving mechanism for moving the holding mechanism in a conveyance direction. The holding mechanism includes a base including a plurality of through holes, a plurality of pipes respectively connected to the through holes, a vacuum (Continued)

generation device configured to evacuate air from the f pipes, and a plurality of absorption assistance valves each disposed in the middle of a respective one of the pipes, each of the plurality of absorption assistance valves being configured to be closed when a flow rate of a gas flowing into the pipe through the through hole becomes equal to or higher than a threshold.

12 Claims, 34 Drawing Sheets

(58) Field of Classification Search
CPC .......... H01L 21/67784; H01L 21/6776; B65G 49/06; B23K 26/10; B23K 26/20
See application file for complete search history.

(56) References Cited

U.S. PATENT DOCUMENTS

2007/0076345 A1* 4/2007 Bang ................. H01L 21/67259
361/234
2012/0193878 A1* 8/2012 Suzuki ................. B65G 49/061
279/3
2013/0025114 A1 1/2013 Mizubata

FOREIGN PATENT DOCUMENTS

| | | |
|---|---|---|
| CN | 102903658 A | 1/2013 |
| CN | 101903129 B | 12/2013 |
| CN | 105830201 A | 8/2016 |
| JP | H05-016088 A | 1/1993 |
| JP | H06-339829 A | 12/1994 |
| JP | H07-050336 A | 2/1995 |
| JP | 2013-030677 A | 2/2013 |
| WO | WO 2013/100149 A1 | 7/2013 |
| WO | WO 2015/174347 A1 | 11/2015 |

OTHER PUBLICATIONS

Office Action dated Dec. 15, 2020, in Chinese Patent Application No. 201780088210.2.

* cited by examiner

LASER IRRADIATION APPARATUS, LASER IRRADIATION METHOD, AND METHOD FOR MANUFACTURING SEMICONDUCTOR DEVICE

TECHNICAL FIELD

The present invention relates to a laser irradiation apparatus, a laser irradiation method, and a method for manufacturing a semiconductor device.

BACKGROUND ART

A laser annealing apparatus that crystallizes an amorphous film formed on a silicon substrate, a glass substrate, or the like by applying laser light to the amorphous film is known. Patent Literature 1 discloses a laser annealing apparatus that applies laser light to a substrate by conveying the substrate using a conveyance unit while levitating the substrate using a levitation unit.

CITATION LIST

Patent Literature

Patent Literature 1: International Patent Publication No. WO2015/174347

SUMMARY OF INVENTION

Technical Problem

According to the technique disclosed in Patent Literature 1, the substrate is irradiated with laser light by conveying the substrate using the conveyance unit while levitating the substrate using the levitation unit. When the substrate is conveyed by using the conveyance unit, the substrate is held by using the conveyance unit. Further, according to the technique disclosed in Patent Literature 1, when the substrate is held, the rear surface of the substrate is absorbed. However, there is a problem that when the substrate is held by adsorption, if the substrate is partially placed on an adsorption surface of the conveyance unit, the substrate cannot be absorbed.

Other problems to be solved and novel features will become apparent from descriptions in this specification and accompanying drawings.

Solution to Problem

A laser irradiation apparatus according to an embodiment includes: a laser generation device configured to generate laser light; a levitation unit configured to levitate an object to be processed to which the laser light is applied; and a conveyance unit configured to convey the levitated object to be processed. The conveyance unit includes: a holding mechanism for holding the object to be processed by absorbing the object to be processed; and a moving mechanism for moving the holding mechanism in a conveyance direction. The holding mechanism includes a base with a plurality of through holes formed therein; a plurality of pipes each of which is connected to a respective one of the plurality of through holes; and a plurality of absorption assistance valves each of which is disposed in the middle of a respective one of the plurality of pipes, each of the plurality of absorption assistance valves being configured to be closed when a flow rate of a gas flowing into the pipe through the through hole becomes equal to or higher than a threshold.

Advantageous Effects of Invention

According to the embodiment, it is possible to provide an excellent laser irradiation apparatus, a laser irradiation method, and a method for manufacturing a semiconductor device.

DESCRIPTION OF EMBODIMENTS

A laser irradiation apparatus and a laser irradiation method according to this embodiment will be described hereinafter with reference to the drawings. Note that the following explanation is given on the assumption that an object to be processed to which laser light is applied is a glass substrate coated with an amorphous silicon film. However, the object to be processed is not limited to any particular component.

An example of the laser irradiation apparatus is an excimer-laser annealing apparatus that applies laser light to an amorphous silicon film formed over a substrate and thereby forms a polysilicon film over the substrate. Therefore, the laser irradiation apparatus is used to manufacture a TFT (Thin Film Transistor) array substrate in a manufacturing process for a liquid-crystal display panel or an organic EL (Electro Luminescence) display panel. That is, the laser irradiation apparatus is used in a manufacturing process for a semiconductor device such as a TFT array substrate.

First Embodiment (Basic Configuration of Laser Irradiation Apparatus 1)

Figure 1:
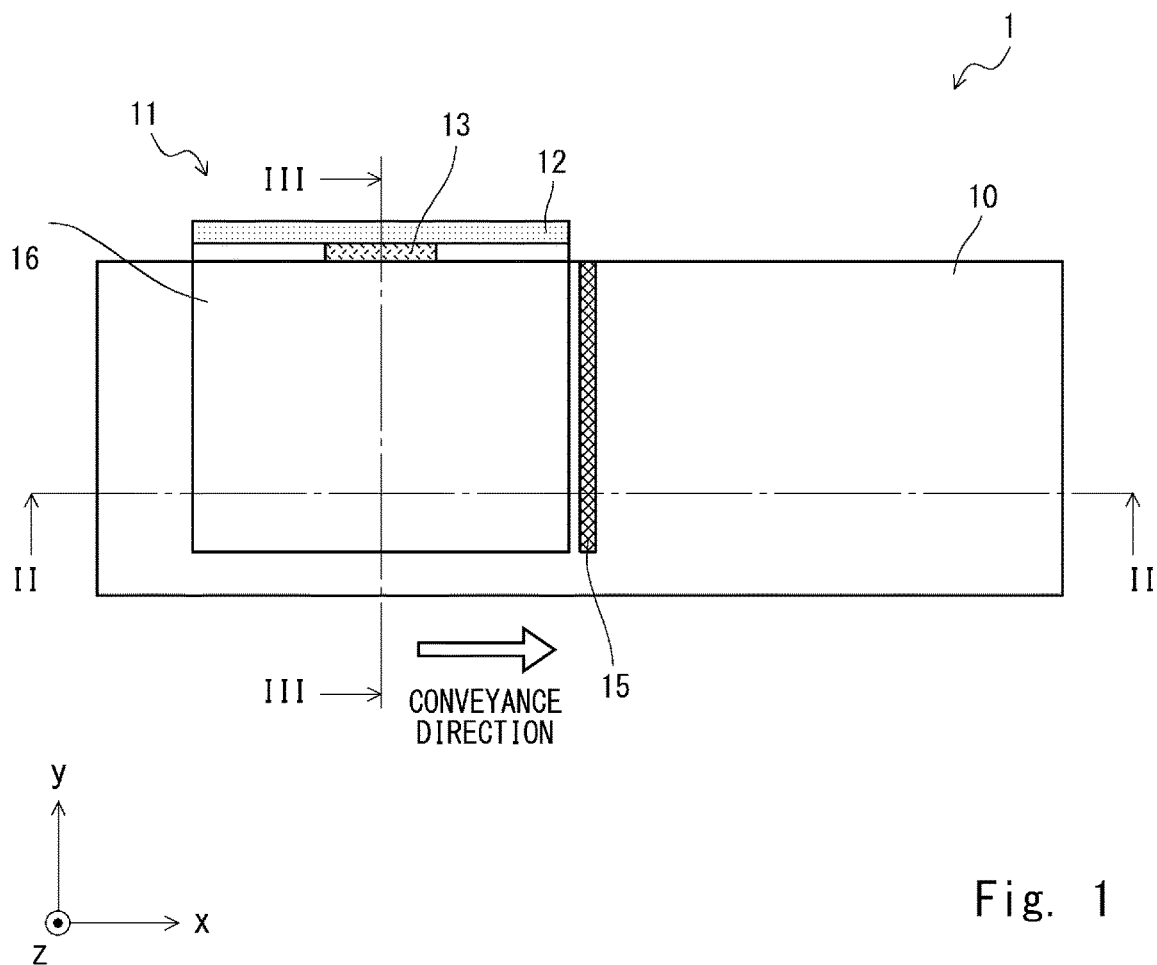
FIG. 1 is a plan view schematically showing a configuration of a laser irradiation apparatus 1 according to a first embodiment.
Figure 2:
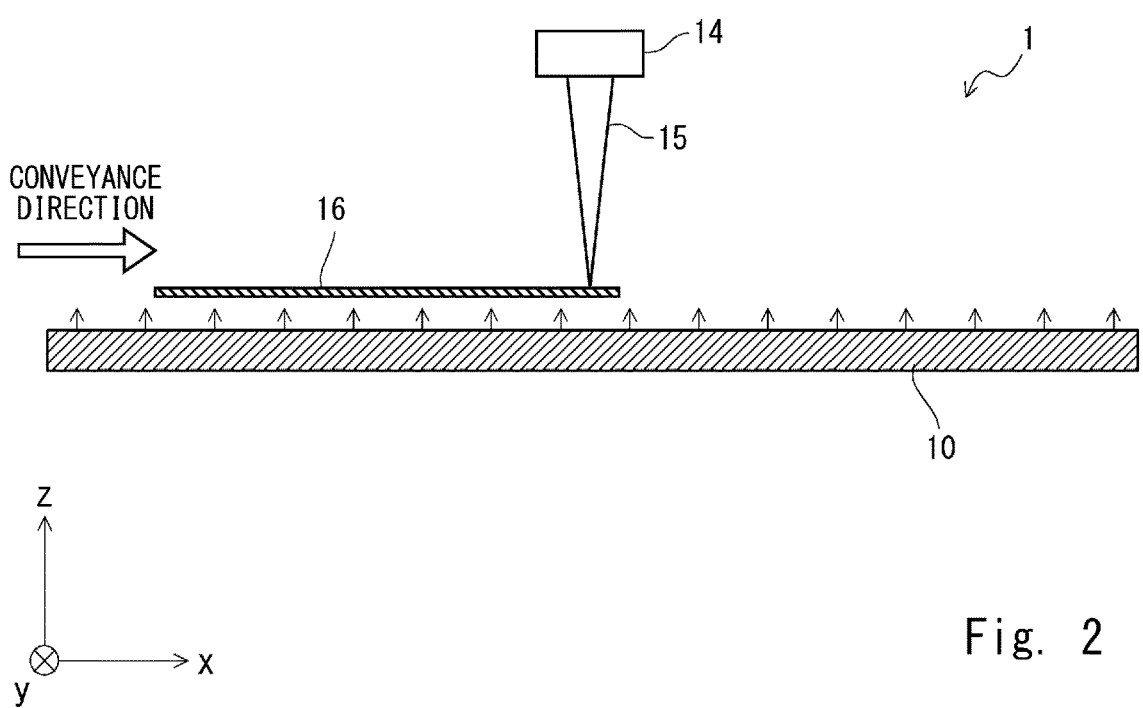
FIG. 2 is a cross section taken along a line II-II in FIG. 1.
Figure 3:
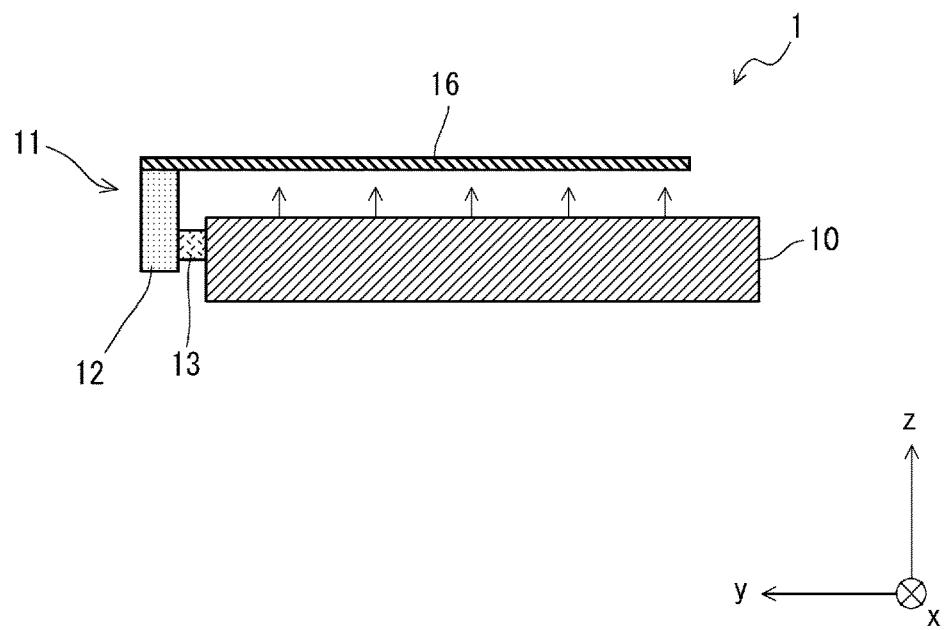
FIG. 3 is a cross section taken along a line in FIG. 1.

A laser irradiation apparatus according this embodiment is, for example, an ELA (Excimer Laser Anneal) apparatus that forms an LTPS (Low Temperature Poly-Silicon) film. Firstly, a basic configuration of the laser irradiation apparatus is described with reference to FIGS. 1 to 3. FIG. 1 is a plan view for explaining the basic configuration of the laser irradiation apparatus. FIG. 2 is a cross section of the laser irradiation apparatus shown in FIG. 1 taken along a cutting line II-II. FIG. 3 is a cross section of the laser irradiation apparatus shown in FIG. 1 taken along a cutting line III-III.

Note that in the figures described below, an xyz three-dimensional orthogonal coordinate system is shown as appropriate for the sake of simplification of the description. The z-direction is a vertical direction and the y-direction is a direction along a linear laser spot. Further, the x-direction is a conveyance direction. Linear laser light along the y-direction is applied to an object to be processed 16 while conveying it in the x-direction (i.e., scanning). Further, the x- and y-directions are directions along edges of the rectangular object to be processed 16.

As shown in FIGS. 1 to 3, the laser irradiation apparatus 1 includes a levitation unit 10, a conveyance unit 11, and a laser generation device 14. As shown in FIG. 2, the levitation unit 10 is configured to eject a gas (e.g., air or nitrogen) from its surface, and the object to be processed 16 is levitated as the gas ejected from the surface of the levitation unit 10 is blown to the bottom surface of the object to be processed 16. For example, the object to be processed 16 is a glass substrate. When the object to be processed 16 is conveyed, the levitation unit 10 adjusts a levitation height so that the object to be processed 16 does not come into contact with other mechanisms (not shown) disposed above the object to be processed 16 and the object to be processed 16 does not come into contact with the levitation unit 10 itself.

The conveyance unit 11 conveys the levitated object to be processed 16 in the conveyance direction (the x-direction). As shown in FIG. 1 and FIG. 3, the conveyance unit 11 includes a holding mechanism 12 and a moving mechanism 13. The holding mechanism 12 holds the object to be processed 16 by adsorption. For example, the holding mechanism 12 can be constructed by using a vacuum adsorption mechanism. The holding mechanism 12 (the vacuum adsorption mechanism) is connected to an evacuation mechanism such as an ejector or a vacuum pump. Therefore, since a negative pressure for sucking a gas acts on the holding mechanism 12, the object to be processed 16 can be held by using the holding mechanism 12.

Further, the holding mechanism 12 includes a raising/descending mechanism for performing an adsorption operation. The raising/descending mechanism includes, for example, an air cylinder or an actuator such as a motor. For example, the holding mechanism 12 adsorbs the object to be processed 16 in a state where the holding mechanism 12 is raised to an adsorbing position. Further, the holding mechanism 12 descends to a standby position in a state where the adsorption is cancelled.

In this embodiment, as shown in FIG. 3, the holding mechanism 12 holds the object to be processed 16 by sucking the surface (the bottom surface) of the object to be processed 16 opposite to the surface (the top surface) thereof to which laser light is applied, i.e., by sucking the surface of the object to be processed 16 that is opposed to the levitation unit 10. Further, the holding mechanism 12 holds an end part of the object to be processed 16 in the +y direction (i.e., an end part in a direction perpendicular to the conveyance direction of the object to be processed 16).

The moving mechanism 13 included in the conveyance unit 11 is connected to the holding mechanism 12. The moving mechanism 13 is configured so that it can move the holding mechanism 12 in the conveyance direction (the x-direction). The conveyance unit 11 (the holding mechanism 12 and the moving mechanism 13) is disposed at an end part of the levitation unit 10 on the y-direction positive side. Further, the object to be processed 16 is conveyed as the moving mechanism 13 moves in the conveyance direction while the holding mechanism 12 is holding the object to be processed 16.

As shown in FIG. 1, for example, the moving mechanism 13 is configured to slide the end part of the levitation unit 10 in the +y direction along the +x direction. Therefore, the object to be processed 16 is conveyed along the x-direction as the moving mechanism 13 slides the end part of the levitation unit 10 along the +x direction. Note that the conveyance speed of the object to be processed 16 can be controlled by controlling the moving speed of the moving mechanism 13. The moving mechanism 13 includes, for example, an actuator such as a motor, a liner guide mechanism, an air bearing, etc. (not shown).

As shown in FIGS. 1 and 2, laser light 15 (hereinafter, a laser-light irradiation place is also indicated by the reference numeral 15) is applied to the object to be processed 16. For example, the laser irradiation apparatus is a laser annealing apparatus. In this case, an excimer laser or the like can be used for the laser generation device 14. Laser light emitted from the laser generation device 14 becomes linear in an optical system including a cylindrical lens (not shown). The object to be processed 16 is irradiated with the linear laser light 15, specifically, laser light 15 having a focal point extending in the y-direction (i.e., a line beam) (see, FIG. 1). In other words, the irradiation place of the laser light 15 over the object to be processed 16 extends in a direction perpendicular to the conveyance direction (the x-direction) of the object to be processed 16 (i.e., extends in the y-direction).

The object to be processed 16 is, for example, a glass substrate on which an amorphous film (an amorphous silicon film) is formed. The amorphous film can be crystallized by irradiating the amorphous film with laser light 15 and performing an annealing process. For example, the amorphous silicon film can be modified to a polycrystalline silicon film (a polysilicon film).

The laser irradiation apparatus 1 shown in FIGS. 1 to 3 conveys the object to be processed 16 in the conveyance direction by holding the bottom surface of the object to be processed 16 using the conveyance unit 11 and while levitating the object to be processed 16 using the levitation unit 10. Note that when the object to be processed 16 is conveyed, the conveyance unit 11 included in the laser irradiation apparatus 1 conveys the object to be processed 16 while the conveyance unit 11 is holding a part of the object to be processed 16 that does not overlap the laser irradiation place 15 in a plan view (i.e., as viewed in the z-direction). That is, as shown in FIG. 1, when the object to be processed 16 is conveyed in the conveyance direction, the part of the object to be processed 16 at which the conveyance unit 11 holds the object to be processed 16 (which corresponds to the position of the holding mechanism 12) does not overlap the laser irradiation place 15.

For example, a planar shape of the object to be processed 16 is a quadrangle (a rectangular) having four sides and the conveyance unit 11 (the holding mechanism 12) holds only one of the four sides of the object to be processed 16. Further, the conveyance unit 11 (the holding mechanism 12) holds a part of the object to be processed 16 that is not irradiated with laser light in a period during which the object to be processed 16 is being conveyed.

Therefore, it is possible to reduce the effect on the object to be processed 16 caused by the holding by the holding mechanism 12 (e.g., warping and reflected laser light) when laser light is applied.

(Holding Mechanism 12)

As described above, the holding mechanism 12 adsorbs and holds only one of the four sides of the object to be processed 16. Note that it is preferable that the holding mechanism 12 can adsorb one side of the object to be processed 16, which is to be held by the holding mechanism 12, irrespective of whether the one side is a long side or a short side.

However, in the case where the holding mechanism 12 holds a short side of the object to be processed 16, there are cases in which the object to be processed 16 is partially placed on an adsorption surface of the holding mechanism 12 for absorbing the object to be processed 16. As a result, a sufficient adsorbing force cannot be obtained and hence the object to be processed 16 cannot be absorbed. Further, in addition to the case where the holding mechanism 12 holds a short side of the object to be processed 16, when the object to be processed 16 is warped, there are also cases in which the object to be processed 16 is partially placed on the adsorption surface of the holding mechanism 12 and hence the object to be processed 16 cannot be adsorbed.

Therefore, it is preferable that the holding mechanism 12 can adsorb the object to be processed 16 even in the state where the object to be processed 16 is partially placed on the adsorption surface of the holding mechanism 12. A preferred example of the holding mechanism 12 will be described hereinafter. However, in order to make understanding of the preferred example of the holding mechanism 12 easier, firstly, a holding mechanism according to a comparative example, which the inventors of the present application have examined, will be explained.

(Holding Mechanism 120A According to Comparative Example 1)

Figure 4:
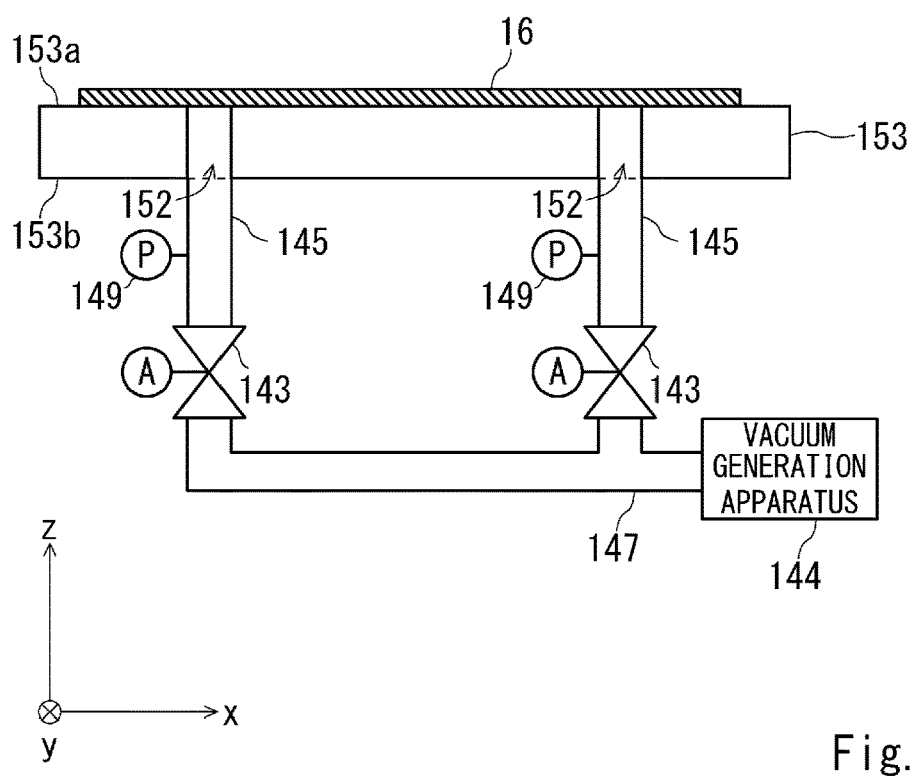
FIG. 4 is a side view schematically showing a configuration of a holding mechanism 120A according to a comparative example 1.
Figure 5:
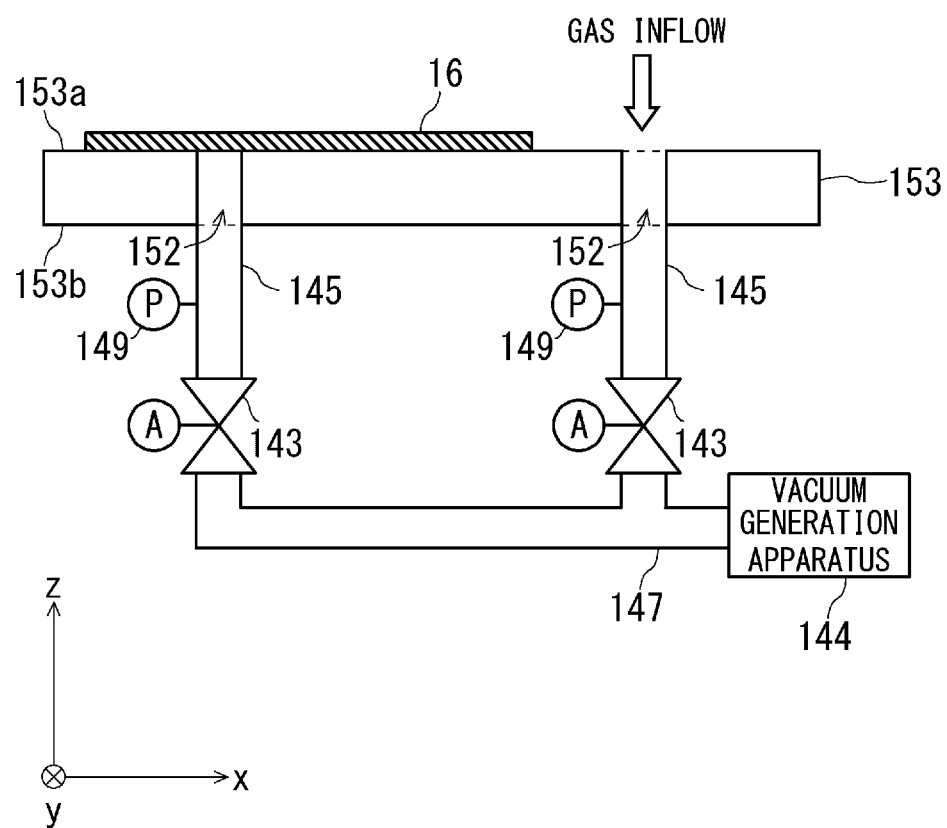
FIG. 5 is a side view schematically showing the configuration of the holding mechanism 120A according to the comparative example 1.

Firstly, a holding mechanism 120A according to a comparative example 1 is described with reference to FIGS. 4 and 5. FIGS. 4 and 5 are side views schematically showing a configuration of the holding mechanism 120A according to the comparative example 1. As shown in FIGS. 4 and 5, the holding mechanism 120A includes a base 153, pipes 145, pressure gauged 149, valves 143, a pipe 147, and a vacuum generation device 144.

The base 153 is, for example, a plate-like component made of metal such as aluminum or stainless steel, granite, or the like. The base 153 includes two through holes 152. The number of through holes 152 is not limited to two, i.e., any number greater than one. The through holes 152 extend from a top surface 153a of the base 153 to a bottom surface 153b thereof. That is, the length of the through holes 152 in the z-direction is equal to the thickness of the base 153. In the holding mechanism 120A, the top surface 153a of the base 153 serves as an adsorption surface on which the object to be processed 16 is absorbed. Each of the two through holes 152 is connected to a respective one of the pipes 145 and each of the two pipes 145 is connected to a respective one of the valves 143. Further, the two valves 143 are connected to the one pipe 147 and the pipe 147 is connected to the vacuum generation device 144.

The vacuum generation device 144 is an evacuation mechanism such as a vacuum pump and an ejector. The vacuum generation device 144 evacuates a gas from the pipes 145 in order to bring the interior of the pipes 145 into a negative-pressure space. Here, it is assumed that the vacuum generation device 144 is an ejector that evacuates the pipes 145 by discharging a gas from the pipes 145 through discharging ports (not shown) by using air supplied from a compressor (not shown). The flow rate of the air supplied by the compressor can be adjusted by a regulator (not shown).

The valves 143 are, for example, air-operated valves whose open/close states are controlled by control signals. When the valves 143 are opened, the vacuum generation device 144 evacuates air from the pipes 145. When the valves 143 are closed, the evacuation from the pipes 145 is stopped.

The pressure gauges 149 communicate with the pipes 145. Therefore, the pressure gauges 149 measure pressures inside the pipes 145. Note that the positions where the pressure gauges 149 are attached are not limited to any particular positions as long as they can measure the pressures inside the pipes 145. For example, ports to which the pressure gauges 149 are attached may be additionally provided in the base 153.

Note that FIG. 4 shows a state in which an object to be processed 16 having a large size in the x-direction is placed on the top surface 153a of the base 153 and two through holes 152 are closed by the object to be processed 16. When the two valves 143 are opened in this state, a gas on the upper side of the base 153 does not flow into the pipes through the through holes 152 because both of the two through holes 152 are closed. Therefore, the vacuum generation device 144 can evacuate air from both of the two pipes 145. As a result, when the amount of air consumed by the vacuum generation device 144 was, for example, 50 L/min (20° C., 1 atm), the interiors of the two pipes 145 became negative-pressure spaces having a pressure of about −50 kPa (gauge). As described above, since the interiors of both of the two pipes 145, which are respectively connected to the two through holes 152 closed by the object to be processed 16, become negative-pressure spaces, it is possible to absorb the object to be processed 16 through the two through holes 152.

Meanwhile, FIG. 5 shows a state in which an object to be processed 16 having a small size in the x-direction is placed on the top surface 153a of the base 153 and only one of the two through holes 152 (only the through hole 152 on the left side in the figure) is closed by the object to be processed 16. When the two valves 143 are opened in this state, a gas flows into the pipe through the through hole 152 located on the right side in the figure. Therefore, the vacuum generation device 144 cannot evacuate air from the pipe 145 located on the left side in the figure. As a result, even when the amount of air consumed by the vacuum generation device 144 was, for example, 50 L/min (20° C., 1 atm), the pressure inside the pipe 145 located on the left side in the figure became substantially equal to the atmospheric pressure, i.e., close to 0 kPa (gauge). As described above, since the interior of the pipe 145 connected to the through hole 152 located on the left side in the figure, which is closed by the object to be processed 16, does not become a negative-pressure space, the object to be processed 16 cannot be absorbed.

(Holding Mechanism 120B According to Comparative Example 2)

Figure 6:
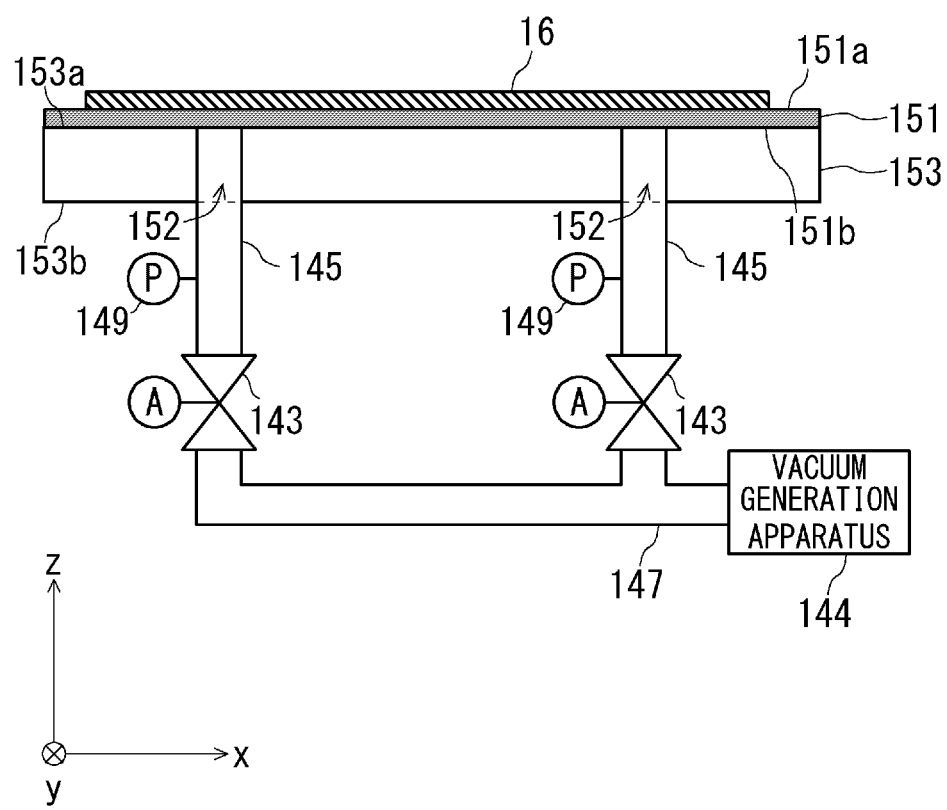
FIG. 6 is a side view schematically showing a configuration of a holding mechanism 120B according to a comparative example 2.
Figure 7:
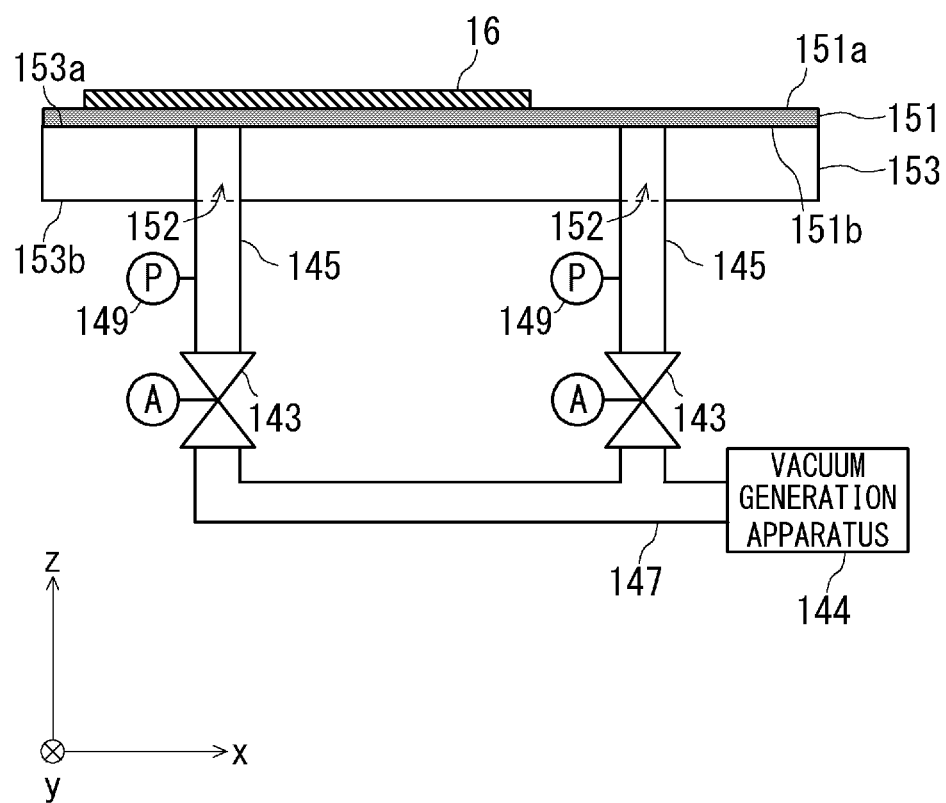
FIG. 7 is a side view schematically showing the configuration of the holding mechanism 120B according to the comparative example 2.

Next, a holding mechanism 120B according to a comparative example 2 is described with reference to FIGS. 6 and 7. FIGS. 6 and 7 are side views schematically showing a configuration of the holding mechanism 120B according to the comparative example 2. As shown in FIGS. 6 and 7, the holding mechanism 120B has a configuration that is obtained by sticking a porous element 151 on the top surface 153a of the base 153 in the holding mechanism 120A according to the comparative example 1 described above with reference to FIGS. 4 and 5.

The porous element 151 has a plate-like shape and includes a top surface 151a and a bottom surface 151b. In the holding mechanism 120B, the top surface 151a of the porous element 151 serves as an adsorption surface on which the object to be processed 16 is absorbed. Further, the bottom surface 151b of the porous element 151 is in contact with the through holes 152. Microscopic pores (i.e., fine pores) are formed inside the porous element 151. The porous element 151 is, for example, a porous ceramic such as an alumina ceramic. Alternatively, the porous element 151 is a porous carbon, a porous metal, or the like.

It is possible to change a flow-path resistance against the inflow of a gas on the upper side of the base 153 by changing the porosity, the pore size, the thickness, etc. of the porous element 151. Since the porous element 151 has microscopic pores, its flow-path resistance is large. Therefore, even when there is a through hole 152 that is not closed by the object to be processed 16, it is possible to suppress the inflow of the gas through the through hole 152.

Note that FIG. 6 shows a state in which an object to be processed 16 having a large size in the x-direction is placed on the top surface 151a of the porous element 151 and two through holes 152 are closed by the object to be processed 16. In this state, it is possible to adsorb the object to be processed 16 through the two through holes 152 as in the case of the holding mechanism 120A according to the comparative example 1 described above with reference to FIG. 4.

Meanwhile, FIG. 7 shows a state in which an object to be processed 16 having a small size in the x-direction is placed on the top surface 151a of the porous element 151 and only one of the two through holes 152 (only the through hole 152 on the left side in the figure) is closed by the object to be processed 16. When the two valves 143 are opened in this state, even though the through hole 152 located on the right side in the figure is not closed by the object to be processed 16, since the flow-path resistance of the porous element 151 is large, it is possible to suppress the inflow of the gas through the through hole 152 located on the right side in the figure. Therefore, the vacuum generation device 144 can evacuate air from of the two pipes 145. As a result, when the amount of air consumed by the vacuum generation device 144 was, for example, 50 L/min (20° C., 1 atm), the interiors of the two pipes 145 became negative-pressure spaces having a pressure of about −50 to −40 kPa (gauge). As described above, even when only the through hole 152 located on the left side in the figure is closed by the object to be processed 16, the interior of the pipe 145 connected to the through hole 152 located on the left side in the figure becomes a negative-pressure space. Therefore, it is possible to absorb the object to be processed 16 through the through hole 152 located on the left side in the figure, i.e., partially absorb the object to be processed 16.

As described above, the holding mechanism 120B according to the comparative example 2 has the configuration in which the porous element 151 is stuck on the top surface 153a of the base 153. In this way, it is possible to absorb the object to be processed 16 even in the state in which the object to be processed 16 is partially placed on the adsorption surface of the holding mechanism 120B.

However, in the holding mechanism 120B, the porous element 151 comes into physical contact with the object to be processed 16. Therefore, there is a problem that the porous element 151, which has a fragile structure, is likely to be broken or cracked due to the physical contact with the object to be processed 16. Further, there are following problems. That is, particles are likely to be generated and the interior of the porous element 151 is likely to be clogged with these particles. As a result, the performance of the porous element 151 deteriorates over long-term use. Further, the porous element 151 is likely to be degraded due to laser light 15 applied to the object to be processed 16.

Further, in the holding mechanism 120B, since the porous element 151 comes into physical contact with the object to be processed 16, there is a possibility that a certain component of the porous element 151 (e.g., sodium) elutes in the form of metal ions into the object to be processed 16. Therefore, it is necessary to use a porous element 151 that does not use the above-mentioned certain component. However, such porous elements 151 have the following problems. That is, their yields are low and they are difficult to manufacture. Further, such porous elements are expensive and difficult to handle because they are easily broken and cracked when used.

(General Configuration of Holding Mechanism 12)

Figure 8:
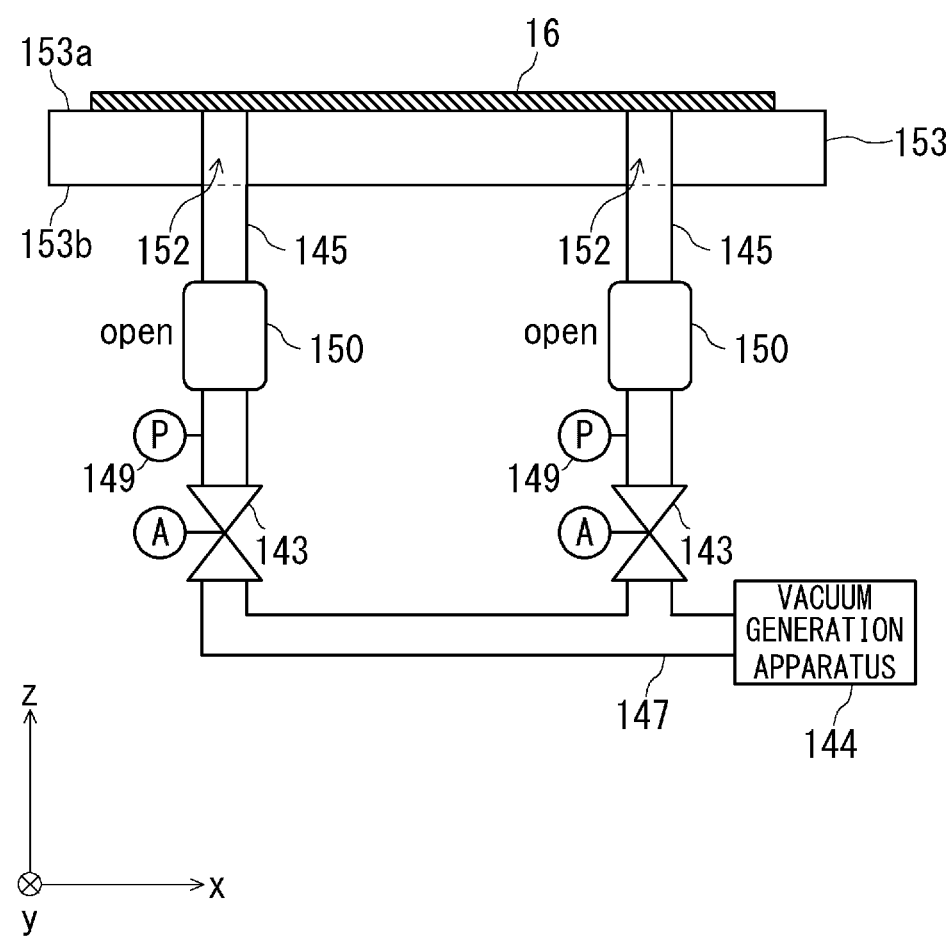
FIG. 8 is a side view schematically showing a configuration of a holding mechanism 12 according to a first embodiment.
Figure 9:
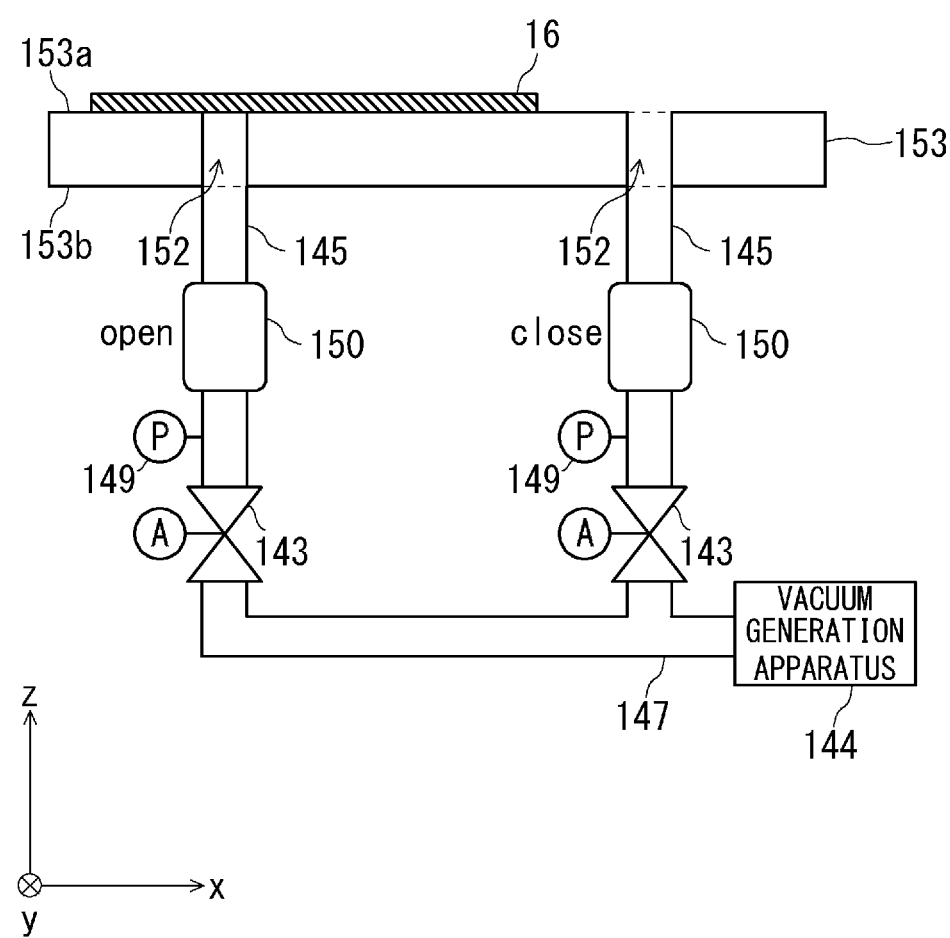
FIG. 9 is a side view schematically showing the configuration of the holding mechanism 12 according to the first embodiment.

Next, a general configuration of the holding mechanism 12 according to this embodiment is described with reference to FIGS. 8 and 9. FIGS. 8 and 9 are side views schematically showing a configuration of the holding mechanism 12 according to this embodiment.

As described above, the holding mechanism 120B according to the comparative example 2, which was described above with reference to FIGS. 6 and 7, can absorb the object to be processed 16 even in a state in which the object to be processed 16 is partially placed on the absorption surface of the holding mechanism 120B. However, since the holding mechanism 120B has the configuration in which the porous element 151 is stuck on the top surface 153a of the base 153, the above-described various problems occur due to the use of the porous element 151.

Therefore, as shown in FIGS. 8 and 9, the holding mechanism 12 has a configuration in which no porous element 151 is stuck on the top surface 153a of the base 153. Since the base 153 is a component made of metal or granite as described above, it is possible to reduce the possibility of the elution of certain components such as sodium to the object to be processed 16 and easily obtain a highly-accurate flat surface. Further, the material of the base 153 is preferably aluminum so that the base 153 can be easily processed. Further, when the base 153 is made of aluminum, it is preferable to apply a surface treatment to the top surface 153a, which serves as the absorption surface for the object to be processed 16.

However, in the case of the configuration in which the porous element 151 is not stuck on the top surface 153a of the base 153, when there is a through hole 152 that is not closed by the object to be processed 16 as in the case of the holding mechanism 120A according to the comparative example 1, which was described above with reference to FIGS. 4 and 5, there is a possibility that the object to be processed 16 cannot be adsorbed because a gas present on the upper side of the base 153 flows into the pipe through this through hole 152.

Therefore, in the holding mechanism 12, an absorption assistance valve 150 is provided in the middle of each of the two pipes 145. The absorption assistance valve 150 is a valve that is opened and closed according to a flow rate of a gas flowing into the pipe 145 through the through hole 152. Specifically, it is a valve that is closed when the flow rate reaches a threshold or higher. The absorption assistance valve 150 can be implemented by, for example, a combination of a flow meter that measures a flow rate of a gas flowing into the pipe through the through hole 152 and a valve that is closed when the flow rate measured by the flow meter reaches the threshold or higher. Alternatively, the absorption assistance valve 150 may be implemented by a single valve having a function equivalent to the above-described combination of the flow meter and the valve. Note that in the holding mechanism 12, a plurality of pressure gauges 149 communicate with interiors of parts of the respective pipes 145 that are located between the absorption assistance valves 150 and the vacuum generation device 144. However, the number of pressure gauges 149 and their positions are not limited to this example. For example, only one pressure gauge 149 may be provided inside the pipe 147.

Here, FIG. 8 shows a state in which an object to be processed 16 having a large size in the x-direction is placed on the top surface 153a of the base 153 and two through holes 152 are closed by the object to be processed 16. When the two valves 143 are opened in this state, a gas on the upper side of the base 153 does not flow into the pipes through the through holes 152 because both of the two through holes 152 are closed. Further, since no gas flows into the pipes through the through holes 152, both of the absorption assistance valves 150 disposed in the middle of the two pipes 145 remain opened. Therefore, the vacuum generation device 144 can evacuate air from the interiors of the two pipes 145. As a result, when the amount of air consumed by the vacuum generation device 144 was, for example, 50 L/min (20° C., 1 atm), the interiors of the two pipes 145 became negative-pressure spaces having a pressure of about −50 kPa (gauge). As described above, since the interiors of both of the two pipes 145, which are respectively connected to the two through holes 152 closed by the object to be processed 16, become negative-pressure spaces, it is possible to absorb the object to be processed 16 through the two through holes 152.

Meanwhile, FIG. 9 shows a state in which an object to be processed 16 having a small size in the x-direction is placed on the top surface 153a of the base 153 and only one of the two through holes 152 (only the through hole 152 on the left side in the figure) is closed by the object to be processed 16. When the two valves 143 are opened in this state, a gas flows into the pipe through the through hole 152 located on the right side in the figure. However, when the flow rate of the flowing gas reaches the threshold or higher, the absorption assistance valve 150 provided in the middle of the pipe 145 located on the right side in the figure is closed. Therefore, after that, the pipe 145 located on the right side in the figure is shut off from the atmosphere and hence the inflow of the gas through the through holes 152 located on the right side in the figure is prevented. Meanwhile, the absorption assistance valve 150 provided in the middle of the pipe 145 located on the left side in the figure remains opened because no gas on the upper side of the base 153 flows into the pipe. Therefore, the vacuum generation device 144 can evacuate air from the interiors of the two pipes 145. As a result, when the amount of air consumed by the vacuum generation device 144 was, for example, 50 L/min (20° C., 1 atm), the two pipes 145 became negative-pressure spaces having a pressure of about −50 to −40 kPa (gauge). As described above, even when only the through hole 152 located on the left side in the figure is closed by the object to be processed 16, the interior of the pipe 145 connected to the through hole 152 located on the left side in the figure becomes a negative-pressure space. Therefore, it is possible to absorb the object to be processed 16 through the through hole 152 located on the left side in the figure, i.e., partially absorb the object to be processed 16.

Figure 10:
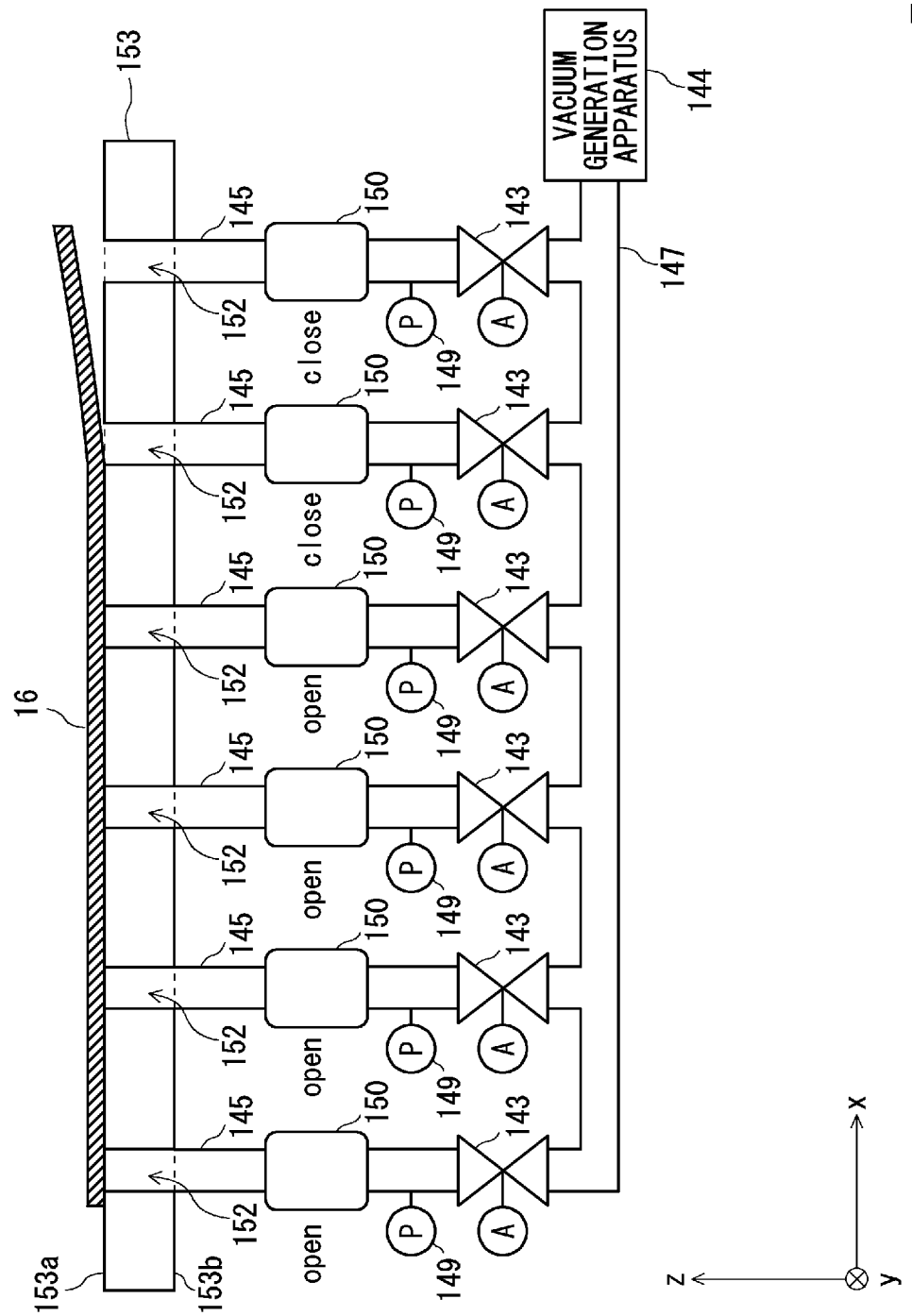
FIG. 10 is a side view schematically showing a configuration of a modified example of the holding mechanism 12 according to the first embodiment.

Next, a modified example of the holding mechanism 12 is described with reference to FIG. 10. FIG. 10 is a side view schematically showing a configuration of a modified example of the holding mechanism 12, in which six through holes 152 are provided. FIG. 10 shows a state in which although an object to be processed 16 having a large size in the x-direction is placed on the top surface 153a of the base 153, an end part of the object to be processed 16 on the x-direction positive side is warped upward and hence two through holes 152 located on the right side in the figure are not completely closed by the object to be processed 16. When the two valves 143 are opened in this state, a gas on the upper side of the base 153 flows into the pipes through the two through holes 152 located on the right side in the figure, which are not closed by the object to be processed 16. Therefore, absorption assistance valves 150 provided in the middle of the two pipes 145 located on the right side in the figure are closed. Meanwhile, absorption assistance valves 150 provided in the middle of the four pipes 145 located on the left side in the figure remain opened. Therefore, the vacuum generation device 144 can evacuate air from the interiors of the six pipes 145. As a result, the interiors of the six pipes 145, which are respectively connected to the six through holes 152, become negative-pressure spaces. Therefore, it is possible to absorb the object to be processed 16 through the four through holes 152 located on the left side in the figure, i.e., partially absorb the object to be processed 16.

(Detailed Configuration of Holding Mechanism 12)

Figure 11:
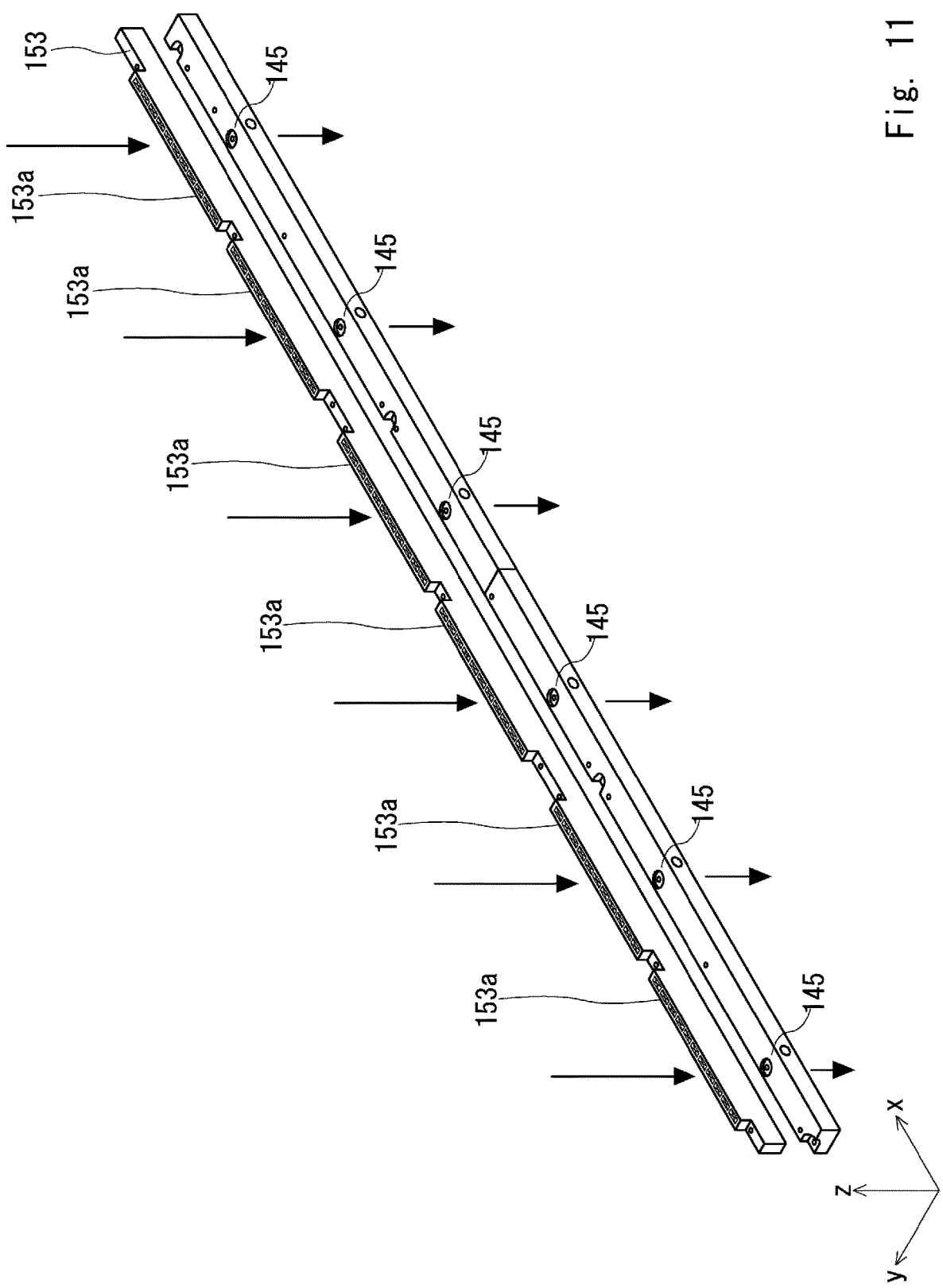
FIG. 11 is an exploded perspective view of the holding mechanism 12 according to the first embodiment in which the holding mechanism 12 is vertically divided at a boundary between a base 153 and a pipe 145.
Figure 12:
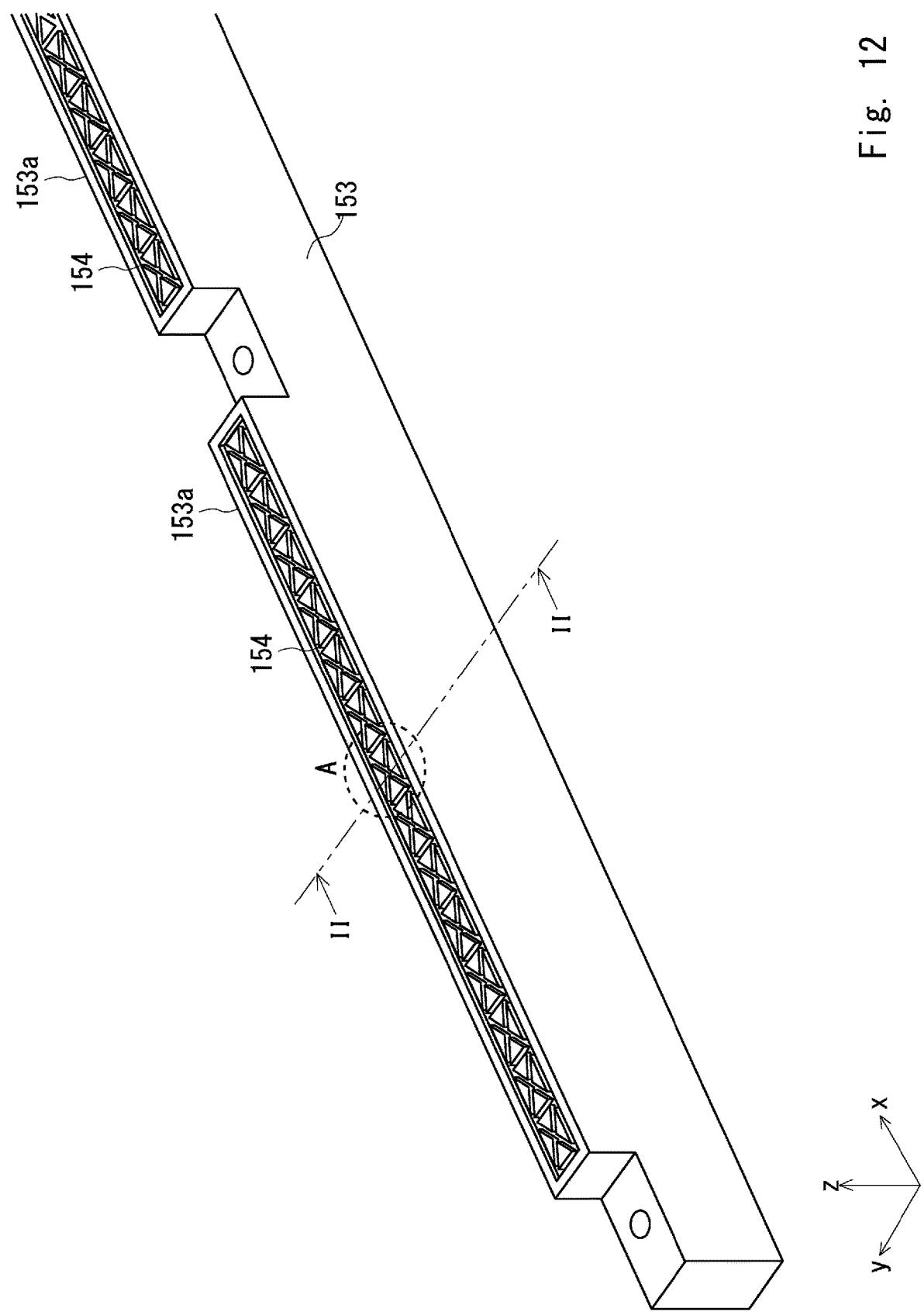
FIG. 12 is an enlarged perspective view of an absorption surface and nearby areas of the holding mechanism 12 shown in FIG. 11.
Figure 13:
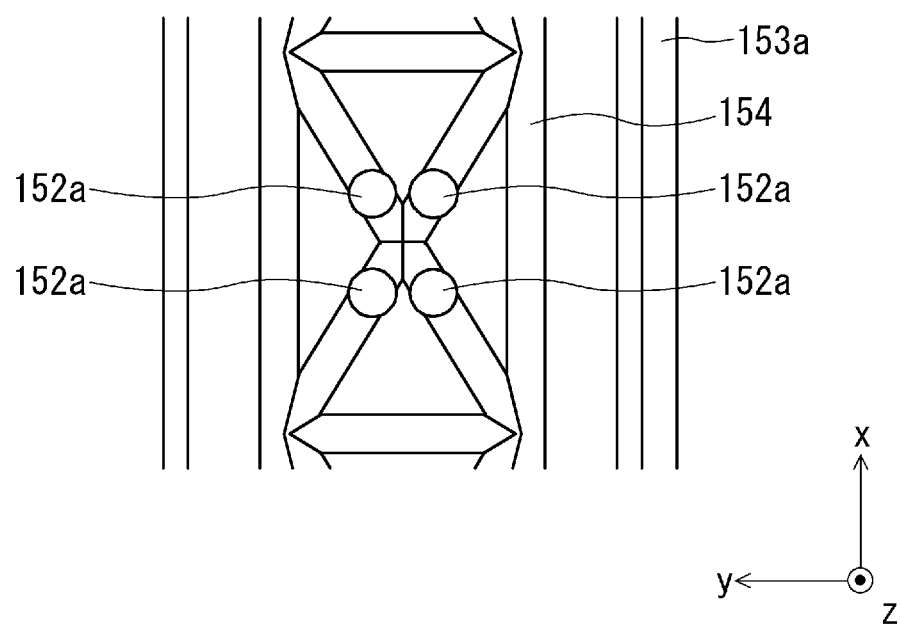
FIG. 13 is an enlarged plan view of an area A shown in FIG. 12.
Figure 14:
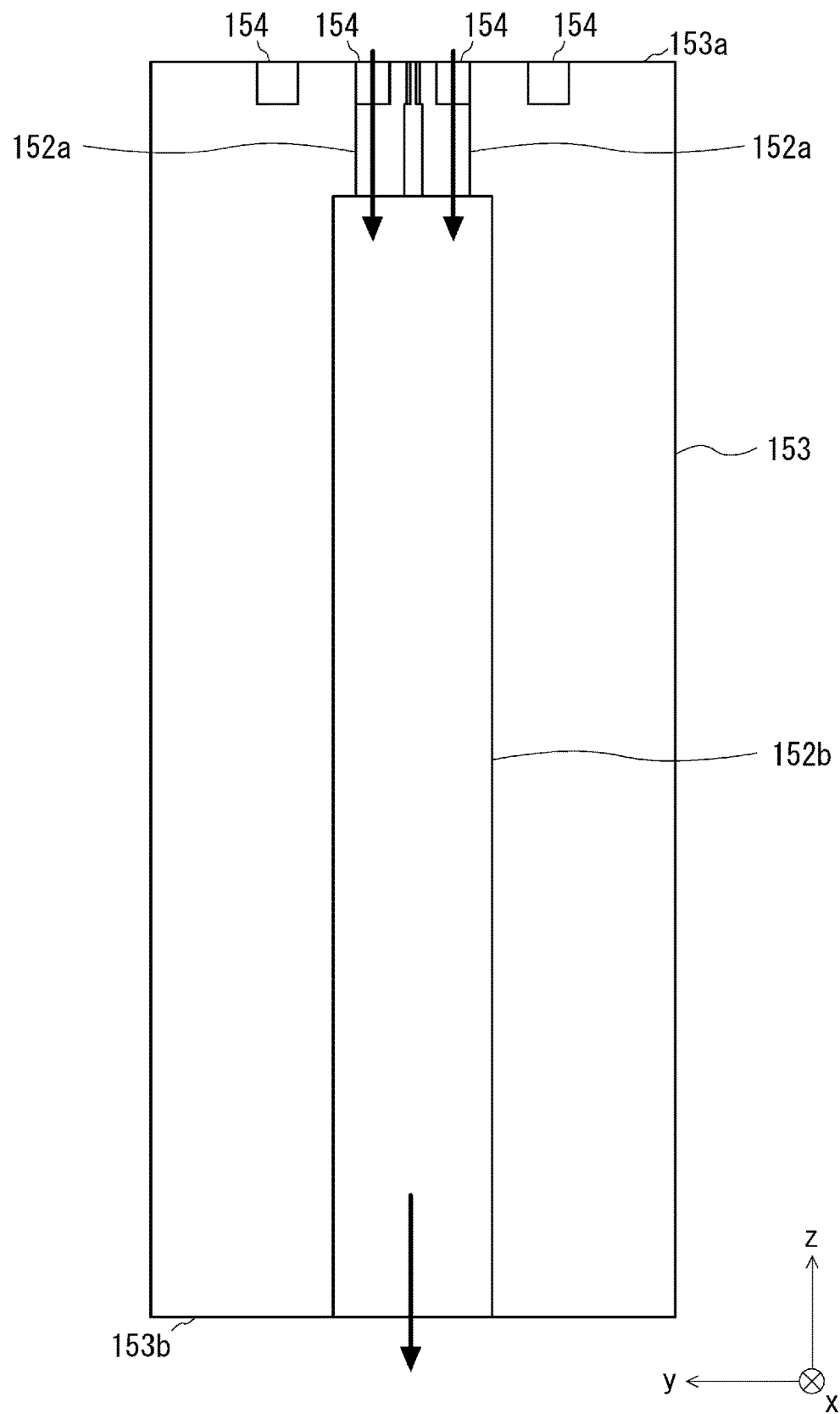
FIG. 14 is a cross section taken along a line II-II in FIG. 12.

Next, a detailed configuration of the holding mechanism 12 according to this embodiment is described with reference to FIGS. 11 to 14. FIG. 11 is an exploded perspective view of the holding mechanism 12 in which the holding mechanism 12 is vertically divided at a boundary between a base 153 and a pipe 145. FIG. 12 is an enlarged perspective view of an absorption surface and nearby areas of the holding mechanism 12. FIG. 13 is an enlarged plan view of an area A of the holding mechanism 12 shown in FIG. 12. FIG. 14 is a cross section of the holding mechanism 12 shown in FIG. 12 taken along a cutting line II-II.

As shown in FIG. 11, in the holding mechanism 12, the top surface 153a, which serves as an adsorption surface on which an object to be processed 16 is absorbed, is divided into a plurality of sections along the conveyance direction of the object to be processed 16 (i.e., along the x-direction). Note that when the size of the top surface 153a in the direction perpendicular to the conveyance direction of the object to be processed 16 (i.e., in the y-direction) is large, the top surface 153a may further be divided along the y-direction as well as along the conveyance direction (the x-direction).

As shown in FIGS. 12 to 14, a through hole 152 is formed at or near the center in the conveyance direction (the x-direction) (i.e., in an area A) in each of the divided top surfaces 153a. As shown in FIGS. 13 and 14, the through hole 152 has a configuration in which four through holes 152a and one through hole 152b having a diameter larger than that of the through holes 152a are connected to each other. The four through holes 152a are opened on each of the divided top surfaces 153a. The number of through holes 152a is an example and is not limited this example. Further, on each of the divided top surfaces 153a, the position in the conveyance direction (the x-direction) where the through hole 152 is formed is not limited to the position at or near the center. That is, the position may be deviated from the center. A pipe 145 is disposed for each of the divided top surfaces 153a, i.e., for each of the through holes 152 and connected to the through hole 152b.

As shown in FIGS. 12 to 14, grooves 154 are formed on each of the top surfaces 153a, so that the object to be processed 16 can be absorbed in a larger area. The shape of the grooves 154 is such that rectangles are arranged in the conveyance direction (the x-direction) so that their long sides are parallel to the conveyance direction (the x-direction), and the opposed apexes of each of the rectangles are connected to each other. However, the shape of the grooves 154 is not limited to this example. The grooves 154 formed on one top surface 153a are connected to each other, thereby forming a gas flow path. The four through holes 152a are formed so that they are opened at the positions where the grooves 154 are present. Therefore, an internal flow path of each of the four through holes 152a is connected to the flow path formed by the grooves 154.

(Effect of Absorption Assistance Valve 150)

In this embodiment, a plurality of through holes 152 are formed in the base 153 in the holding mechanism 12. Further, in the middle of each of a plurality of pipes 145, which are connected to the respective through holes 152, the absorption assistance valve 150, which is opened and closed according to the flow rate of a gas flowing into the pipe 145 through the through hole 152, is disposed.

In a configuration in which no absorption assistance valve 150 is provided, when there is a through hole 152 that is not closed by the object to be processed 16, a gas flows into the pipe 145 though the through hole 152 as in the case of the holding mechanism 120A according to the comparative example 1. Therefore, it is impossible to evacuate air from the pipe 145 and hence impossible to bring the interior of the pipe 145 into a negative-pressure space. Therefore, it is impossible to absorb the object to be processed 16.

In contrast, in the configuration in which absorption assistance valves 150 are provided, even when there is a through hole 152 that is not closed by the object to be processed 16, since the absorption assistance valve 150 disposed in the middle of the pipe 145 connected to that through hole 152 is closed, the inflow of the gas through the through hole 152 is prevented. As a result, since the interior of the pipe 145 connected to the through hole 152 is brought into a negative-pressure space, the object to be processed 16 can be adsorbed, i.e., can be partially adsorbed.

Further, even when none of the plurality of through holes 152 is closed by the object to be processed 16, the inflow of the gas through the plurality of through holes 152 is prevented because all the absorption assistance valves 150, which are disposed in the middle of the plurality of pipes 145 connected to the plurality of through holes 152, are closed. It should be noted, in this case, the vacuum pressure is smaller (i.e., the pressure is closer to zero) than the pressure in the case in which at least one of the plurality of through holes 152 is closed by the object to be processed 16.

Therefore, the holding mechanism 12 may store the pressure in the state in which none of the plurality of through holes 152 is closed by the object to be processed 16 as a pressure for determining whether or not an object to be processed 16 is placed, i.e., as an absorption determination threshold for determining whether or not an object to be processed 16 is absorbed. In this case, when a measured pressure measured by the pressure gauge 149 is lower than the threshold (when the measured pressure is higher than the threshold in the negative direction; the same applies to the descriptions below), the holding mechanism 12 can determine that the adsorption is completed. Further, when the measured pressure is equal to or higher than the threshold (when the measured pressure is equal to the threshold or is between the threshold and zero; the same applies to the descriptions below), the holding mechanism 12 can determine that the adsorption is not completed.

Then, when it is determined that the adsorption of the object to be processed 16 is completed, the moving mechanism 13 moves the holding mechanism 12 (see FIG. 1 and the like). That is, it is possible to use the detection of the adsorption of the object to be processed 16 as a trigger for starting the conveyance of the object to be processed 16. A control system for performing a determination of absorption of an object to be processed 16 and an operation of the moving mechanism 13 will be described hereinafter with reference to FIG. 15.

Figure 15:
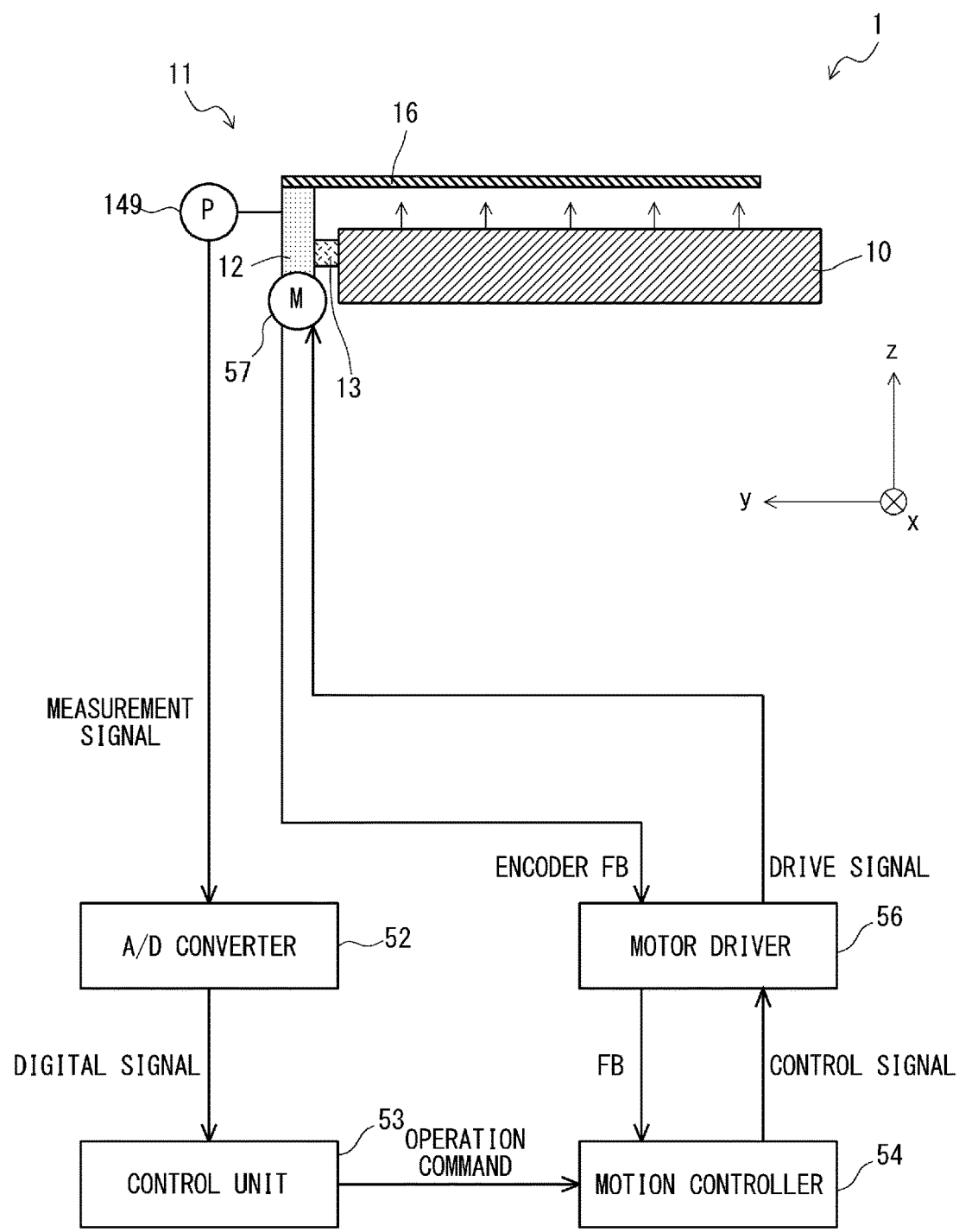
FIG. 15 is a diagram for explaining a control system of the holding mechanism 12 according to the first embodiment.

A laser irradiation apparatus 1 includes an A/D converter 52, a control unit 53, a motor driver 56, a motion controller 54, and a motor 57. The motor 57 is an actuator disposed in the moving mechanism 13 and moves the holding mechanism 12 in the conveyance direction (in the +x direction in FIG. 1). The motor driver 56 drives the motor 57. Further, the laser irradiation apparatus 1 also includes the above-described conveyance unit 11, the holding mechanism 12, the moving mechanism 13, the levitation unit 10, the pressure gauge 149, etc. Note that the pressure gauge 149 in FIG. 15 is an arbitrary one of the plurality of pressure gauges 149 disposed in the respective pipes 145. The pressure gauge 149 in FIG. 15 may be selected from among pressure gauges 149 disposed in pipes 145 connected to through holes 152 that are likely to be closed by an object to be processed 16 (e.g., through holes 152 located at or near the center in the conveyance direction (the x-direction)).

The pressure gauge 149 measures a pressure of the interior of the pipe 145 with which the pressure gauge 149 communicates, and outputs a measurement signal corresponding to the measured pressure to the A/D converter 52. The A/D converter 52 converts the analog measurement signal into a digital signal. Then, the A/D converter 52 outputs the digital measurement signal to the control unit 53. The control unit 53 is an arithmetic processing unit including a CPU, a memory, etc. Further, the control unit 53 controls each device provided in the laser irradiation apparatus 1 (e.g., a valve 143, various actuators such as a motor and a cylinder, and a laser generation device 14).

The control unit 53 makes a decision on absorption by comparing the value of the measurement signal (the measured pressure) with a predetermined threshold. That is, when the measured pressure is lower than the threshold, the control unit 53 determines that the adsorption is completed. When the measured pressure is equal to or higher than the threshold, the control unit 53 determines that the adsorption is not completed. As described above, the control unit 53 serves as a determination unit that makes a decision on absorption.

The control unit 53 outputs an operation command corresponding to the result of the absorption decision to the motion controller 54. That is, when it is determined that the absorption is completed, the control unit 53 outputs an operation command to the motion controller 54. Since the operation command serves as a trigger for starting a movement, the movement is started by the moving mechanism 13.

Specifically, the motion controller 54 outputs a control signal to the motor driver 56 in the form of pulses or through communication. As a result, the motor driver 56 outputs a drive signal corresponding to the control signal to the motor 57. Therefore, the motor 57 of the moving mechanism 13 moves the holding mechanism 12 in the +x direction. The object to be processed 16 held by the holding mechanism 12 is conveyed in the +x direction.

Further, an encoder value is output from an encoder of the motor 57 to the motor driver 56. The motor driver 56 outputs a feedback signal corresponding to the encoder value to the motion controller 54. Then, the motion controller 54 performs feedback control according to the feedback signal. In this way, the object to be processed 16 is conveyed in the +x direction by a predetermined conveyance distance at a predetermined conveyance speed.

Figure 16:
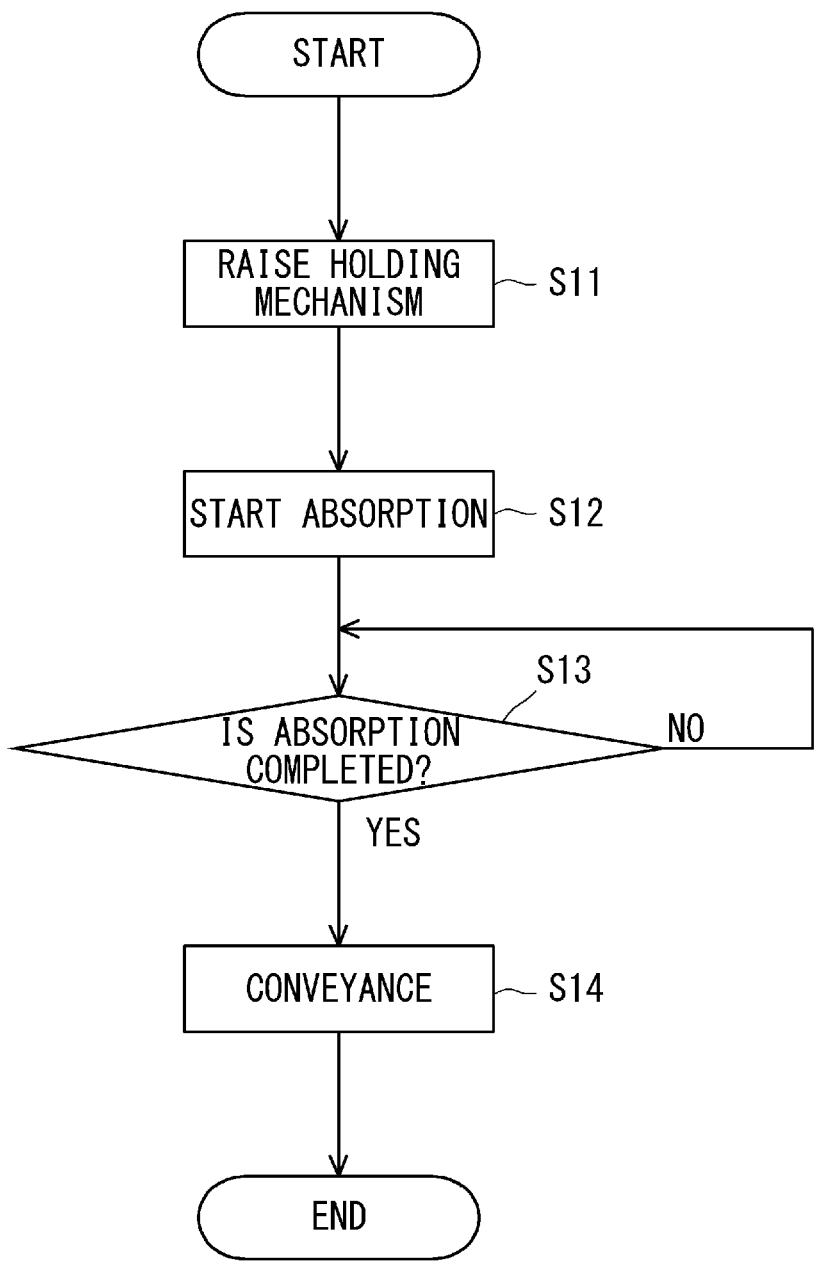
FIG. 16 is a flowchart showing processes performed when a substrate is absorbed.

Next, a process for adsorbing and conveying an object to be processed 16 is described with reference to FIG. 16. FIG. 16 is a flowchart showing a process for adsorbing and conveying an object to be processed 16.

Firstly, the holding mechanism 12 raises (S11). That is, the holding mechanism 12 disposed below an object to be processed 16 moves in the +z direction to a position where the holding mechanism 12 comes into contact with the object to be processed 16. Then, absorption by the holding mechanism 12 is started (S12). Specifically, the control unit 53 opens the valves 143 shown in FIG. 8 and the like. As a result, the interiors of the pipes 145 are evacuated and have a negative pressure. Next, the control unit 53 determines whether or not the absorption is completed (S13). That is, the control unit 53 compares a measured value of the pressure gauge 149 with a threshold and makes a decision on the adsorption according to the result of the comparison. When it is determined that the adsorption is not completed (NO at S13), the adsorption decision in the step S13 is repeated until the adsorption is completed. That is, when the pressure inside the pipes 145 is equal to or higher than the threshold, the conveyance is not started until the pressure inside the pipes 145 becomes lower than the threshold.

When it is determined that the adsorption is completed (YES at S13), the object to be processed 16 is conveyed (S14). That is, when the pressure inside the pipes 145 becomes lower than the threshold, the motor 57 of the moving mechanism 13 starts to operate. As a result, the object to be processed 16 held by the holding mechanism 12 is conveyed in the +x direction.

Figure 17:
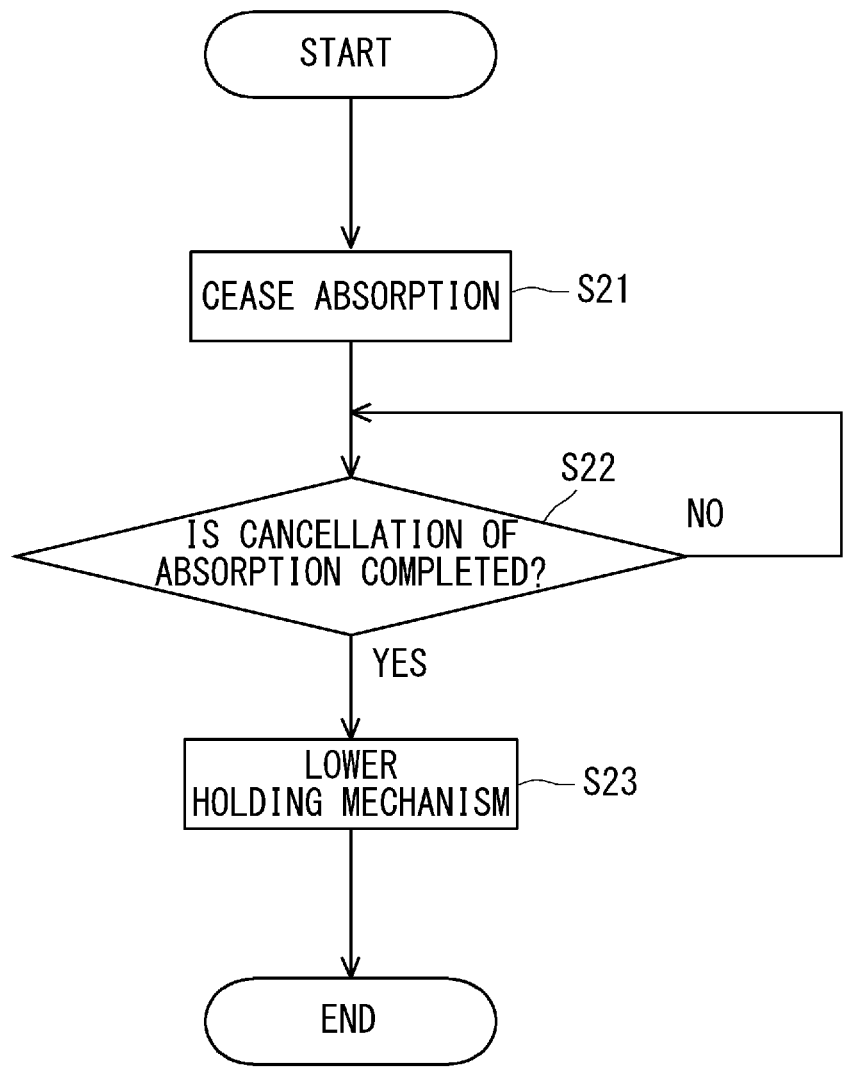
FIG. 17 is a flowchart showing processes performed when releasing the absorption of the substrate is cancelled.

Next, a process for cancelling adsorption of an object to be processed 16 is described with reference to FIG. 17. FIG. 17 is a flowchart showing a process for cancelling absorption.

Firstly, the adsorption of the object to be processed 16 is ceased (cancelled) (S21). Specifically, when the control unit 53 closes the valves 143 shown in FIG. 8 and the like, the pressure inside the pipes 145 rises. Next, the control unit 53 determines whether or not the cancellation of the absorption is completed (S22). That is, the control unit 53 compares the measured value of the pressure gauge 149 with a threshold and makes a decision on the cancellation of the absorption according to the result of the comparison. When it is determined that the cancellation of the absorption is not completed (NO at S22), the absorption decision in the step S22 is repeated until the cancellation of the absorption is completed. That is, when the pressure in the pipes 145 is lower than the threshold, the holding mechanism 12 waits until the pressure in the pipes 145 becomes equal to or higher than the threshold.

When it is determined that the cancellation of the absorption is completed (YES at S22), the holding mechanism 12 descends (S23). That is, the holding mechanism 12, which have been in contact with the object to be processed 16, moves in the −z direction to a position where the holding mechanism 12 is apart from the object to be processed 16. By doing so, the process for canceling the absorption is completed.

Note that in the above-described example, a pressure gauge 149 is provided for each of a plurality of pipes 145. Then, one pressure gauge 149 disposed in a pipe 145 connected to a through hole 152 that is likely to be closed by an object to be processed 16 is selected from among the plurality of pressure gauges 149. However, the invention is not limited to this example. When one or more through holes 152 that are likely to be closed by an object to be processed 16 are known in advance, a pressure gauge 149 may be provided only in each of one or more pipes 145 that are respectively connected to the one or more through holes 152. When two or more pressure gauges 149 are provided in this manner, one pressure gauge 149 may be selected from among these two or more pressure gauges 149. Further, when only one pressure gauge 149 is provided, the selecting procedure may be omitted.

As described above, in this embodiment, the absorption decision and the absorption cancellation decision are made according to the pressure measured by the pressure gauge 149. That is, it is determined whether or not the holding mechanism 12 is adsorbing the object to be processed 16 by comparing the measured pressure value with the threshold. By doing this, it is possible to appropriately and quickly determine whether or not the object to be processed 16 is absorbed.

After the control unit 53 determines that the holding mechanism 12 has adsorbed the object to be processed 16, the moving mechanism 13 starts to move. After the control unit 53 determines that the holding mechanism 12 is not adsorbing the object to be processed 16, the holding mechanism 12 raises and descends. In this way, it is possible to quickly perform the operation of the conveyance unit 11 and hence to reduce the cycle time. Further, it is possible to prevent the holding mechanism 12 from moving before the absorption is completed.

Second Embodiment (Basic Configuration of Laser Irradiation Apparatus 2)

Figure 18:
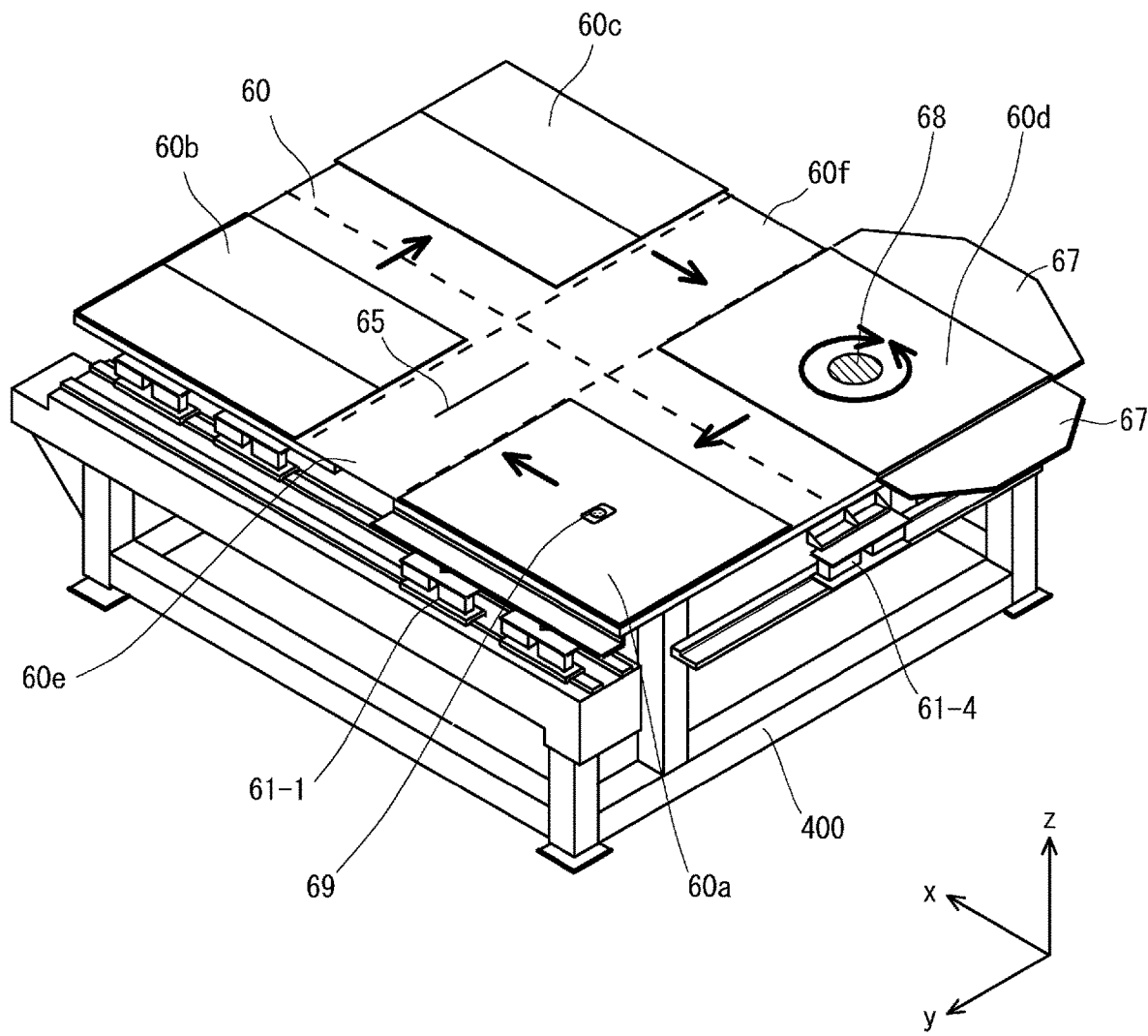
FIG. 18 is a perspective view showing an overall configuration of a laser irradiation apparatus 2 according to a second embodiment.
Figure 19:
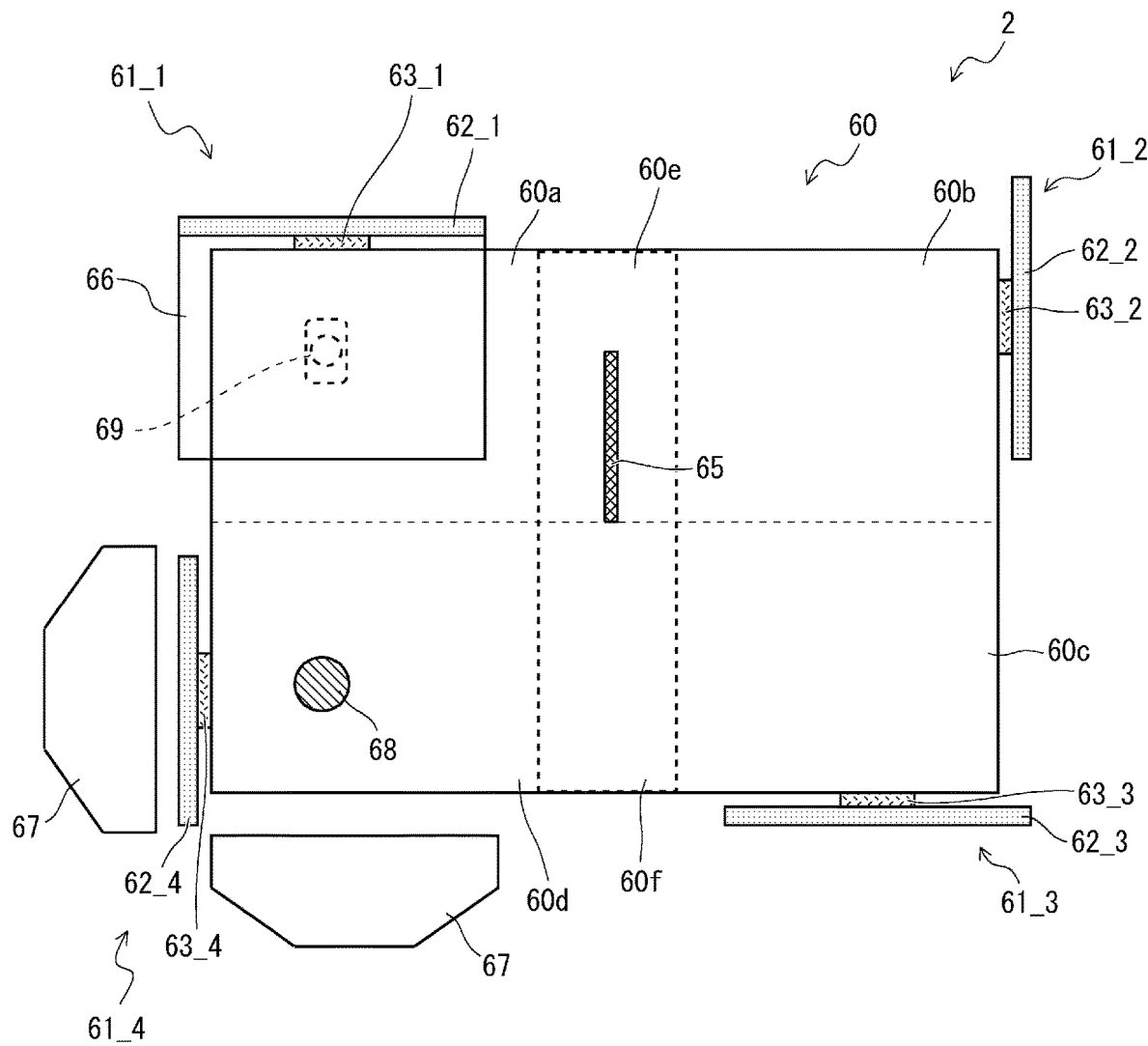
FIG. 19 is a plan view schematically showing a configuration of the laser irradiation apparatus 2 according to the second embodiment.

A laser irradiation apparatus 2 according to a second embodiment is described with reference to FIGS. 18 and 19. FIG. 18 is a perspective view showing a configuration of a main part of the laser irradiation apparatus 2. FIG. 19 is an xy-plane view showing a configuration of a main part of the laser irradiation apparatus 2. Note that descriptions of components/structures that are the same as those of the first embodiment are omitted as appropriate. For example, since basic configurations of conveyance units 61_1 to 61_4, holding mechanisms 62_1 to 62_4, and moving mechanisms 63_1 to 63_4 are similar to those of the conveyance unit 11, the holding mechanism 12, and the moving mechanism 13 shown in the first embodiment, their descriptions are omitted as appropriate. Further, it is possible to perform processes shown in FIGS. 16 and 17 by using the control system shown in FIG. 15. Further, in this embodiment, an amorphous silicon film is also modified to a polysilicon film by applying laser light 65 from a laser irradiation apparatus to an object to be processed 66 in a manner similar to that of the first embodiment.

A levitation unit 60 is configured to eject a gas from its surface, and the object to be processed 66 is levitated as the gas ejected from the surface of the levitation unit 60 is blown to the bottom surface of the object to be processed 66. The levitation unit 60 is disposed over a pedestal 400.

Further, the levitation unit 60, which has a rectangular shape in an xy-plane view, is divided into six areas 60a to 60f. Specifically, the levitation unit 60 includes first to fourth area 60a to 60d, an irradiation area 60e, and a monitoring area 60f. The first area 60a is a rectangular area including a corner that is located on the x-direction negative side and the y-direction positive side (an upper-left corner in FIG. 19). The second area 60b is a rectangular area including a corner that is located on the x-direction positive side and the y-direction positive side (an upper-right corner in FIG. 19). The third area 60c is a rectangular area including a corner that is located on the x-direction positive side and the y-direction negative side (a lower-right corner in FIG. 19). The fourth area 60d is a rectangular area including a corner that is located on the x-direction negative side and the y-direction negative side (a lower-left corner in FIG. 19).

The irradiation area 60e is disposed between the first and second areas 60a and 60b. The irradiation area 60e is an area to which laser light is applied. That is, a laser irradiation place 65 is included in the irradiation area 60e. The monitoring area 60f is disposed between the third and fourth areas 60c and 60d. Therefore, half of the area of the levitation unit 60 located on the y-direction positive side (i.e., an upper half area in FIG. 19) is composed of the first area 60a, the irradiation area 60e, and the second area 60b, which are arranged in this order from the x-direction negative side (i.e., from the left side in FIG. 19). Half of the area of the levitation unit 60 located on the y-direction negative side (i.e., a lower half area in FIG. 19) is composed of the third area 60c, the irradiation area 60f, and the fourth area 60d, which are arranged in this order from the x-direction positive side.

In the xy-plane view, the first to fourth areas 60a to 60d may have substantially the same size as each other. In the xy-plane view, the irradiation area 60e and the monitoring area 60f may be rectangular and have substantially the same size. In this case, the first and fourth areas 60a and 60d are arranged side by side in the y-direction. The second and third areas 60b and 60c are arranged side by side in the y-direction. The irradiation area 60e and the monitoring area 60f are arranged side by side in the y-direction.

Further, an alignment mechanism 69 is provided in the first area 60a. The alignment mechanism 69 adsorbs and holds an object to be processed 66 in a manner similar to that of the holding mechanism 12 according to the first embodiment. Further, the alignment mechanism 69 adjusts the position and the rotation angle of the object to be processed 66. For example, there is a possibility that the position and the rotation angle of the object to be processed 66 are slightly deviated due to a carrying-in operation, a conveyance operation, and a rotation operation of the object to be processed 66. The alignment mechanism 69 corrects deviations in the position and the rotation angle. In this way, it is possible to accurately control the irradiation place of laser light on the object to be processed 66.

Further, a rotation mechanism 68 is provided in the fourth area 60d. The rotation mechanism 68 absorbs and holds the object to be processed 66 in a manner similar to that of the holding mechanism 12 according to the first embodiment. Further, the rotation mechanism 68 rotates the object to be processed 66 around a rotation axis parallel to the z-direction (hereinafter referred to as the z-axis). Further, the rotation mechanism 68 includes an actuator such as a motor that rotates the object to be processed 66 around the z-axis.

Further, auxiliary levitation units 67 are provided on outer sides of the fourth area 60d. The auxiliary levitation units 67 are disposed on the y-direction negative side and the x-direction positive side, respectively, of the fourth area 60*d*. When a part of the object to be processed 66 projects to the outside of the levitation unit 60 while the object to be processed 66 is being rotated by the rotation mechanism 68, no levitation force is generated by the levitation unit 60 in that projected part. Therefore, an amount of warping of the object to be processed 66 may increase. Similarly to the levitation unit 60, each of the auxiliary levitation units 67 is configured to eject a gas from its surface. Therefore, a levitation force is generated in the part of the object to be processed 66 projected from the levitation unit 60 as the gas ejected from the surface of the auxiliary levitation unit 67 is blown to the bottom surface of the object to be processed 66. By configuring as described above, the rotation mechanism 68 can rotate the object to be processed 66 without damaging the object to be processed 66.

The object to be processed 66 is successively conveyed from the first area 60*a* to the fourth area 60*d*. That is, after the object to be processed 66 is conveyed from the first area 60*a* in the +x direction, it passes through the irradiation area 60*e* and moves to the second area 60*b*. When the object to be processed 66 passes through the irradiation area 60*e*, it is irradiated with laser light. As the object to be processed 66 is conveyed from the second area 60*b* in the −y direction, it moves to the third area 60*c*.

As the object to be processed 66 is conveyed in the −x direction from the third area 60*c*, it passes through the monitoring area 60*f* and moves to the fourth area 60*d*. In the monitoring area 60*f*, irradiation of the laser light is monitored for its unevenness by photographing the object to be processed 66. As the object to be processed 66 is conveyed in the +y direction from the fourth area 60*d*, it moves to the first area 60*a*.

As described above, the object to be processed 66 is conveyed while changing the conveyance direction from the +x direction, to the −y direction, to the −x direction, and to the +y direction. In other words, the object to be processed 66 is conveyed so as to circulate from the first area 60*a* to the fourth area 60*d*. Note that, strictly speaking, since the fourth area 60*d* is the position to which the object to be processed 66 is carried in and from which it is carried away, the object to be processed 66 is conveyed from the fourth area 60*d*, to the first area 60*a*, to the second area 60*b*, and to the third area 60*c* in this order. Needless to say, the position to which the object to be processed 66 is carried in and from which it is carried away is not limited to the fourth area 60*d*.

Further, the object to be processed 66 may be circulated in the opposite direction. For example, the object to be processed 66 may be conveyed in the order of the fourth area 60*d*, the third area 60*c*, the second area 60*b*, and the first area 60*a*. That is, the conveyance direction may be clockwise or anticlockwise in the plan view shown in FIG. 19. The conveyance direction may be switched as appropriate according to the process of the laser irradiation apparatus 2.

(Conveyance Units 61_1 to 61_4)

Since the object to be processed 66 is conveyed in a circulative manner as described above, the laser irradiation apparatus 2 includes four conveyance units 61_1 to 61_4. The conveyance units 61_1 to 61_4 are disposed on the outer side of the levitation unit 60 and in the vicinity of the respective sides of the levitation unit 60.

The levitation unit 60 has a rectangular shape in the xy-plane view and each of the conveyance units 61_1 to 61_4 is disposed so that it conveys the object to be processed 66 along the respective side of the levitation unit 60. Note that although each of the conveyance units 61_1 to 61_4 is disposed on the outer side of the respective side of the levitation unit 60, it may be disposed on the inner side of the levitation unit 60.

Specifically, the conveyance unit 61_1 is disposed on a side of the levitation unit 60 located on the y-direction positive side and includes a holding mechanism 62_1 and a moving mechanism 63_1. Further, the conveyance unit 61_1 can convey the object to be processed 66 from the first area 60*a* to the second area 60*b* by moving the moving mechanism 63_1 in the +x direction while holding the object to be processed 66 by the holding mechanism 62_1. The object to be processed 66 passes the irradiation area 60*e* through the conveyance by the conveyance unit 61_1. Therefore, laser light 65 is applied to the object to be processed 66 when the object to be processed 66 is conveyed from the first area 60*a* to the second area 60*b*.

The conveyance unit 61_2 is disposed on a side of the levitation unit 60 located on the x-direction positive side and includes a holding mechanism 62_2 and a moving mechanism 63_2. Further, the conveyance unit 61_2 can convey the object to be processed 66 from the second area 60*b* to the third area 60*c* by moving the moving mechanism 63_2 in the −y direction while holding the object to be processed 66 by the holding mechanism 62_2.

The conveyance unit 61_3 is disposed on a side of the levitation unit 60 located on the y-direction negative side and includes a holding mechanism 62_3 and a moving mechanism 63_3. Further, the conveyance unit 61_3 can convey the object to be processed 66 from the third area 60*c* to the fourth area 60*d* by moving the moving mechanism 63_3 in the −x direction while holding the object to be processed 66 by the holding mechanism 62_3. The object to be processed 66 passes the monitoring area 60*f* through the conveyance by the conveyance unit 61_3.

The conveyance unit 61_4 is disposed on a side of the levitation unit 60 located on the x-direction negative side and includes a holding mechanism 62_4 and a moving mechanism 63_4. Further, the conveyance unit 61_4 can convey the object to be processed 66 from the fourth area 60*d* to the first area 60*a* by moving the moving mechanism 63_4 in the +y direction while holding the object to be processed 66 by the holding mechanism 62_4.

At the timing when the conveyance direction of the object to be processed 66 is changed, a handing-over operation for handing over the object to be processed 66 between two of the conveyance units 61_1 to 61_4 is performed. For example, when the conveyance unit 61_2 conveys the object to be processed 66 to the second area 60*b*, a handing-over operation from the conveyance unit 61_2 to the conveyance unit 61_3 is performed. Specifically, when the conveyance unit 61_2 conveys the object to be processed 66 to the third area 60*c*, the holding mechanism 62_2 of the conveyance unit 61_2 cancels the absorption and the holding mechanism 62_3 of the conveyance unit 61_3 adsorbs the object to be processed 66. As the conveyance units 61_1 to 61_4 hand over the object to be processed 66 from one conveyance unit to another as described above, the above-described conveyance can be performed.

Further, the alignment mechanism 69 performs a handing-over operation between the conveyance units 61_4 and 61_1. For example, the object to be processed 66, which has been conveyed to the first area 60*a* by the conveyance unit 61_4, is handed-over from the conveyance unit 61_4 to the alignment mechanism 69. Further, the object to be processed 66, which has been aligned by the alignment mechanism 69, is handed-over from the alignment mechanism 69 to the conveyance unit 61_1.

Further, the rotation mechanism 68 performs a handing-over operation between the conveyance units 61_3 and 61_4. For example, the object to be processed 66, which has been conveyed to the fourth area 60d by the conveyance unit 61_3, is handed over from the conveyance unit 61_3 to the rotation mechanism 68. The object to be processed 66, which has been rotated by the rotation mechanism 68, is handed over from the rotation mechanism 68 to the conveyance unit 61_4.

(Holding Mechanisms 62_1 to 62_4)

Each of the holding mechanisms 62_1 to 62_4 has a configuration similar to that of the first embodiment and adsorb an object to be processed 66. The holding mechanisms 62_2 and 62_4 are disposed in a direction different from that of the holding mechanisms 62_1 and 62_3. More specifically, in the xy-plane view, each of the holding mechanisms 62_1 and 62_3 has a rectangular shape whose longitudinal direction is parallel to the x-direction. Further, each of the holding mechanisms 62_2 and 62_4 has a rectangular shape whose longitudinal direction is parallel to the y-direction. The holding mechanisms 62_1 to 62_4 are disposed so that they move in their longitudinal directions.

Further, the size of each of the holding mechanisms 62_1 to 62_4 may be changed depending on whether it holds a short side of the object to be processed 66 having a rectangular shape or holds a long side thereof. For example, in FIG. 19, the long-side direction of the object to be processed 66 is parallel to the x-direction and the short-side direction thereof is parallel to the y-direction. Specifically, the size of the object to be processed 66 in the x-direction is about 1,850 mm and the size thereof in the y-direction is about 1,500 mm. Therefore, since the holding mechanisms 62_1 and 62_3 hold the long sides of the object to be processed 66, the size of them in the moving direction (the x-direction) is equal to the long sides of the object to be processed 66. Since the holding mechanisms 62_2 and 62_4 hold the short sides of the object to be processed 66, the size of them in the moving direction (the y-direction) is equal to the short sides of the object to be processed 66. In this case, the size of the holding mechanisms 62_1 and 62_3 in the y-direction is about 10 mm and the size of the holding mechanisms 62_2 and 62_4 in the x-direction is about 35 mm. That is, the width of the holding mechanisms 62_2 and 62_4 is larger than the width of the holding mechanisms 62_1 and 62_3. Regarding the holding mechanism 62_1, the object to be processed 66, which is held by the holding mechanism 62_1, passes through the irradiation area 60e. Therefore, it is possible to secure a large area that can be irradiated with laser light on the object to be processed 66 by reducing the area of the object to be processed 66 held by the holding mechanism 62_1. Further, when the long side is held, the moment exerted to the object to be processed 66 is smaller than the moment that is exerted when the short side is held. Therefore, it is preferable to reduce the width of the holding mechanism 62_1. In contrast, regarding the holding mechanisms 62_2 and 62_4, the object to be processed 66, which is held by the holding mechanisms 62_2 and 62_4, does not pass through the irradiation area 60e. Therefore, it is more important to reliably hold the object to be processed 66. Further, when the short side is held, a larger moment is exerted to the object to be processed 66 than the moment that is exerted when the long side is held. Therefore, a larger adsorption force is required. Therefore, it is preferable to increase the width of the holding mechanisms 62_2 and 62_4. Note that although the width of the holding mechanism 62_3 is equal to that of the opposed holding mechanism 62_1. However, the width of the holding mechanism 62_3 may be equal to that of the adjacent holding mechanisms 62_2 and 62_4 in order to give a priority to the reliable holding of the object to be processed 66. Each of the holding mechanisms 62_1 to 62_4 holds the object to be processed 66 by adsorbing an end part of the object to be processed 66. Further, FIG. 19 shows a configuration in which each of the holding mechanisms 62_1 to 62_4 is disposed over the entire length of its respective side of the object to be processed 66. However, the holding mechanism does not necessarily have to be disposed over the entire length of the respective side of the object to be processed 66. That is, each of the holding mechanisms 62_1 to 62_4 may partially hold its respective side of the object to be processed 66. Specifically, the holding mechanisms are arranged so that a place of the object to be processed 66 held by each holding mechanism does not overlap places thereof held by other holding mechanisms that hold the adjacent sides. Further, the size of the object to be processed 66 is not limited to the above-described size. That is, the size of the object to be processed 66 may be equal to or smaller than the above-described size.

Note that in the laser irradiation apparatus 2 according to the second embodiment, the length of the laser irradiation place 65 in the y-direction is about half of the length of the object to be processed 66 in the y-direction. Therefore, when the object to be processed 66 passes through the laser irradiation place 65, laser light is applied to half of the area on the object to be processed 66 in the y-direction. Therefore, the object to be processed 66 is conveyed so as to circulate twice over the levitation unit 60. By doing so, substantially the entire surface of the object to be processed 66 is irradiated with laser light.

When substantially the entire surface of the object to be processed 66 is irradiated with laser light as described above, a rotation mechanism 68 that rotates the object to be processed 66 by 180 degrees while maintaining the horizontal surface (the xy-plane) of the object to be processed 66 is provided in the fourth area 60d of the levitation unit 60 as shown in FIGS. 18 and 19. That is, after the object to be processed 66 is conveyed from the first area 60a to the second area 60b by using the conveyance unit 61_1 and laser light 65 is applied to the object to be processed 66, the object to be processed 66 is rotated by 180 degrees by using the rotation mechanism 68 while conveying the object to be processed 66 by using the conveyance units 61_2 to 61_4. Then, the object to be processed 66 is conveyed from the area 60a to the area 60b by using the conveyance unit 61_1 and the laser light 65 is applied to the object to be processed 66 again, so that the entire surface of the object to be processed 66 can be irradiated with the laser light 65.

In this embodiment, in order to irradiate the entire surface of the object to be processed 66 with the laser light 65, the rotation mechanism 68 rotates the object to be processed 66 by 180 degrees. However, the rotation mechanism 68 may be configured so that it can rotate the object to be processed 66 by 90 degrees. For example, in the case in which the unevenness of the irradiation of the laser light over the object to be processed 66 is large, it is preferable to increase the number of times of the circulative conveyance by one and thereby to perform the irradiation of the laser light again. In that case, depending on the place where the unevenness of the irradiation of the laser light over the object to be processed 66 is large, it may be more efficient to rotate the object to be processed 66 by the rotation mechanism 68 by 90 degrees than rotating it by 180 degrees. Therefore, it is preferable that the rotation mechanism 68 be configured so that it can rotate the object to be processed 66 by 90 degrees as well as rotating it by 180 degrees.

In this case, regarding the holding mechanisms 62_1 to 62_4, the one side of the object to be processed 66 that is held by one of the holding mechanisms 62_1 to 62_4 is either the long side or the short side. Therefore, it is preferable that each of the holding mechanisms 62_1 to 62_4 can absorb the one side irrespective of whether the one side is the long side or short side.

In this embodiment, the size of each of the holding mechanisms 62_1 and 62_3 in the movement direction (the x-direction) is equal to the long side of the object to be processed 66. Therefore, when one of the holding mechanisms 62_1 and 62_3 holds the short side of the object to be processed 66, the object to be processed 66 is partially placed on its absorption surface. However, by configuring each of the holding mechanisms 62_1 to 62_4 so that it is roughly similar to the holding mechanism 12, which is capable of implementing the function of partial absorption as shown in the first embodiment, each of the holding mechanisms 62_1 and 62_3 can hold the short side of the object to be processed 66. Meanwhile, the size of each of the holding mechanisms 62_2 and 62_4 in the moving direction (the y-direction) is equal to the short side of the object to be processed 66. Therefore, when one of the holding mechanisms 62_2 and 62_4 holds the long side of the object to be processed 66, it partially holds the long side of the object to be processed 66. In this case, since all the through holes 152 in the one of the holding mechanisms 62_2 and 62_4 are closed by the object to be processed 66, it can hold the long side of the object to be processed 66.

Preferred examples of the holding mechanisms 62_1 to 62_4 are described hereinafter. Firstly, a preferred example of the holding mechanism 62_1 is described.

In this embodiment, because an object to be processed 66 held by the holding mechanism 62_1 passes through the irradiation area 60e, the holding mechanism 62_1 is similar to the holding mechanism 12 shown in the first embodiment in this feature. Therefore, similarly to the holding mechanism 12 shown in the first embodiment, the holding mechanism 62_1 can be configured as shown in FIGS. 11 to 14. Further, the width of the holding mechanism 62_1, i.e., its size in the y-direction is preferably small. Therefore, the holding mechanism 62_1 preferably has a size of about 10 mm in the y-direction.

Figure 20:
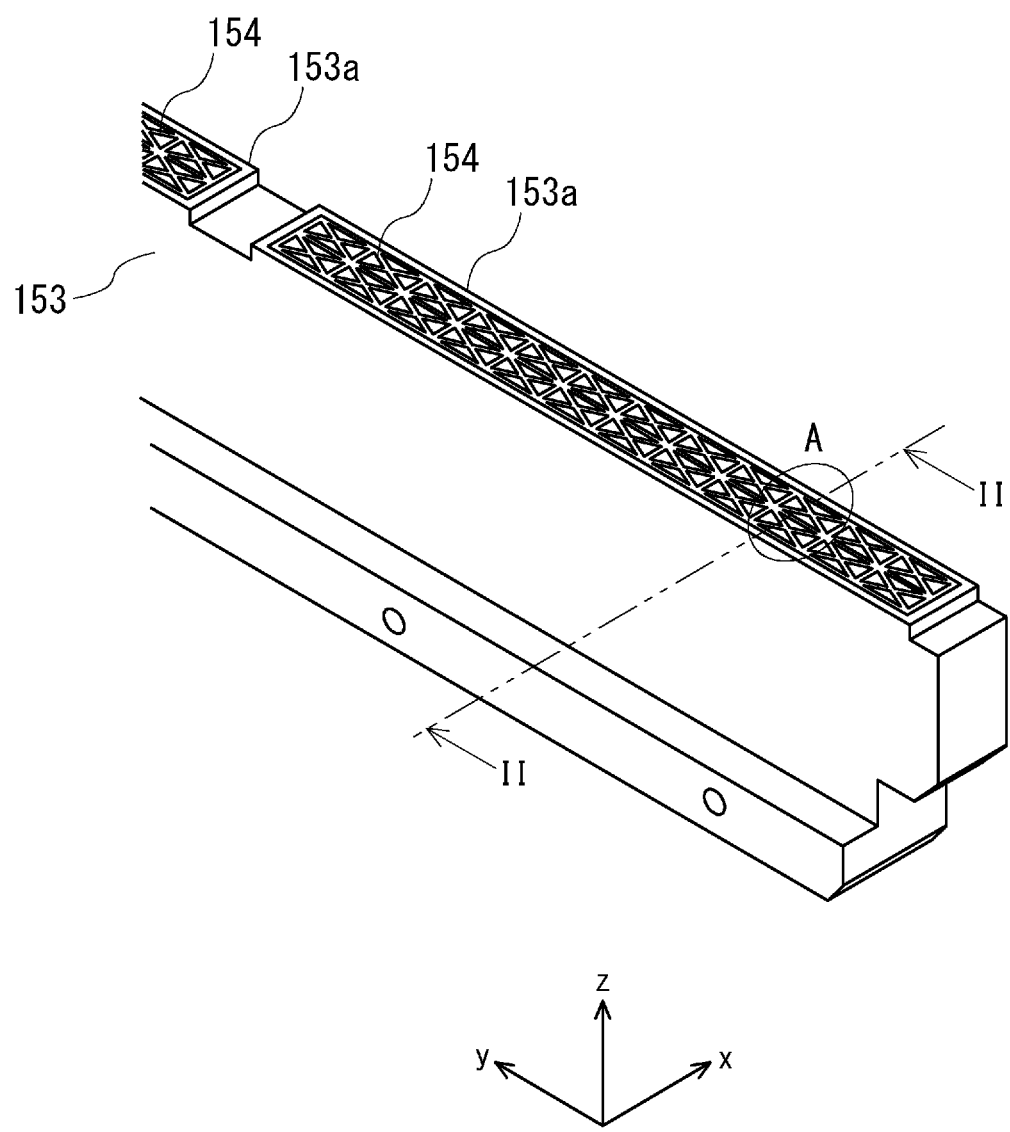
FIG. 20 is an enlarged perspective view of an absorption surface and nearby areas of a holding mechanism 62_2 according to the second embodiment.
Figure 21:
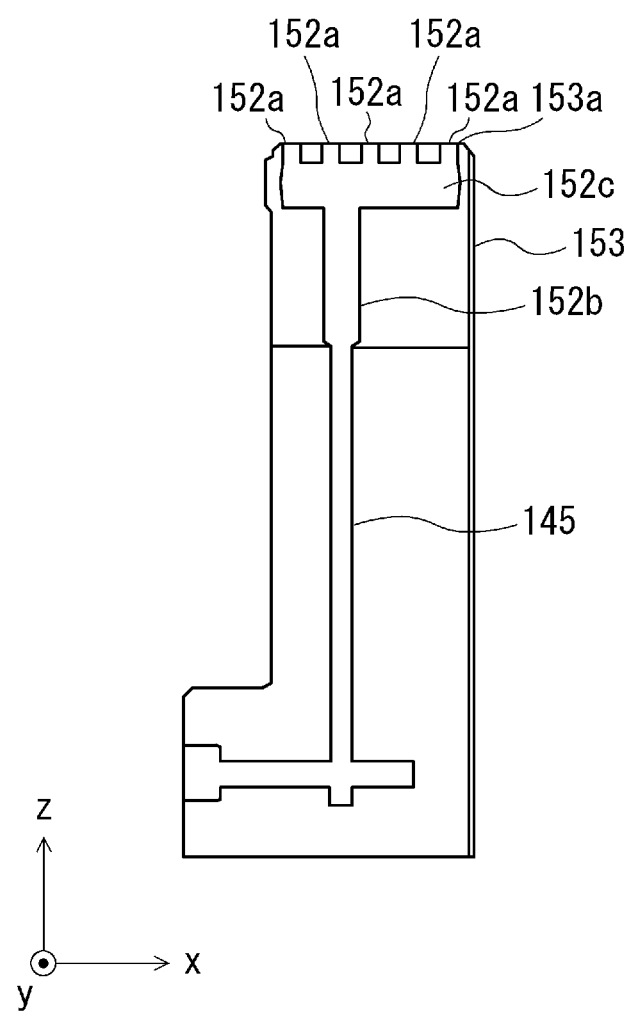
FIG. 21 is a cross section taken along a line II-II in FIG. 20.

Next, a preferred example of the holding mechanism 62_2 is described with reference to FIGS. 20 and 21. FIG. 20 is an enlarged perspective view of the absorption surface and nearby areas of the holding mechanism 62_2. FIG. 21 is a cross section of the holding mechanism 62_2 shown in FIG. 20 taken along a cutting line II-II. The cutting line II-II in FIG. 20 is a cutting line at or near an area A where the through hole 152 is formed. Note that in FIGS. 20 and 21, illustration of the absorption assistance valve 150 is omitted.

In this embodiment, in general, the holding mechanism 62_2 holds the short side. Therefore, in order to obtain a larger absorption force, the holding mechanism 62_2 preferably has a large width, i.e., a large size in the x-direction. Therefore, as shown in FIGS. 20 and 21, the holding mechanism 62_2 has a large size of about 35 mm in the x-direction. Further, the holding mechanism 62_2 has a configuration in which one additional row of grooves 154 having the same shape as that of the holding mechanism 12 shown in the first embodiment is added in the x-direction, i.e., two rows of grooves 154 are arranged in the x-direction. Further, since the holding mechanism 62_2 has a large size in the x-direction, five through holes 152a are formed in the x-direction. These through holes 152a are connected to a space 152c and the space 152c is connected to a through hole 152b.

The rest of the configuration of the holding mechanism 62_2 is similar to that of the holding mechanism 12 shown in the first embodiment. However, since the holding mechanism 62_2 has a large size in the x-direction, the top surface 153a of the base 153 may also be divided in the x-direction as well as in the conveyance direction (the y-direction). In this case, a through hole 152 is formed in each of the divided top surfaces 153a. Therefore, two or more through holes 152 are provided in the y-direction and two or more through holes 152 are provided in the x-direction.

Figure 22:
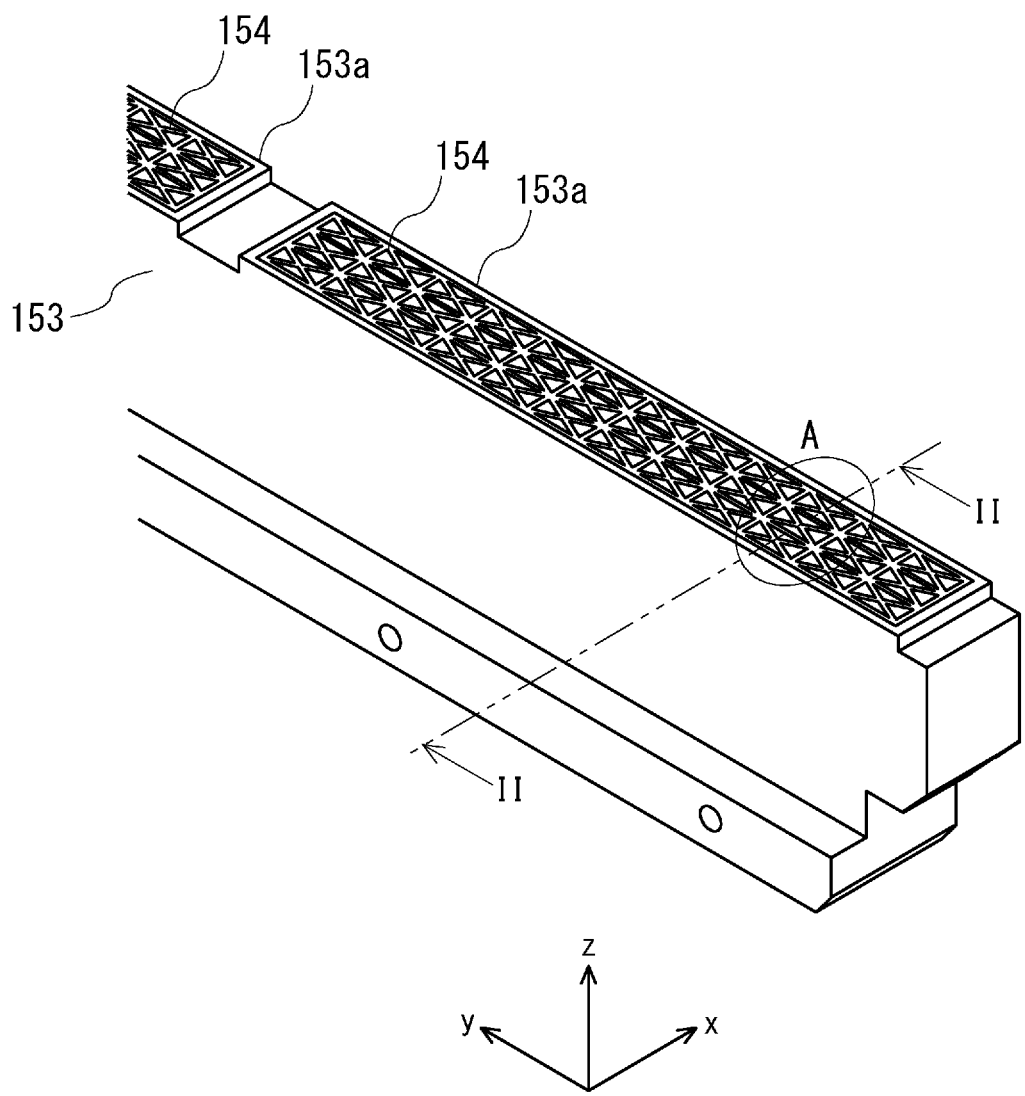
FIG. 22 is an enlarged perspective view of an absorption surface and nearby areas of a modified example of the holding mechanism 62_2 according to the second embodiment.
Figure 23:
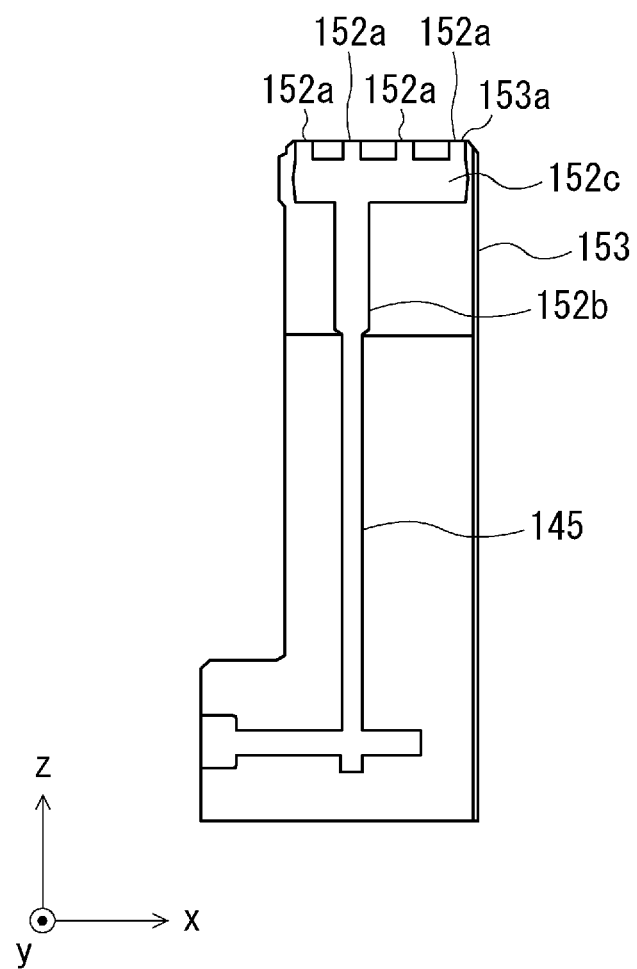
FIG. 23 is a cross section taken along a line II-II in FIG. 22.

Next, a modified example of the holding mechanism 62_2 is described with reference to FIGS. 22 and 23. FIG. 22 is an enlarged perspective view of an absorption surface and nearby areas of a modified example of the holding mechanism 62_2. FIG. 23 is a cross section of the holding mechanism 62_2 shown in FIG. 22 taken along a cutting line II-II. The cutting line II-II in FIG. 22 is a cutting line at an area A where the through hole 152 is formed. Note that in FIGS. 22 and 23, illustration of the absorption assistance valve 150 is omitted.

As shown in FIGS. 22 and 23, the holding mechanism 62_2 has a large size of about 35 mm in the x-direction. Further, the holding mechanism 62_2 has a configuration in which two additional rows of grooves 154 each of which has the same shape as that of the holding mechanism 12 shown in the first embodiment are added in the x-direction, i.e., three rows of grooves 154 are arranged in the x-direction. Further, since the holding mechanism 62_2 has a large size in the x-direction, four through holes 152a are formed in the x-direction. These through holes 152a are connected to a space 152c and the space 152c is connected to a through hole 152b. The rest of the configuration is similar to that shown in FIGS. 20 and 21.

Note that the holding mechanism 62_4 may have a configuration similar to that of the holding mechanism 62_2. That is, the holding mechanism 62_4 may have a configuration similar to that shown in FIGS. 20 and 21 or that shown in FIGS. 22 and 23. Further, the holding mechanism 62_3 may have a configuration similar to that of either the holding mechanism 62_1 or 62_2. That is, the holding mechanism 62_3 may have a configuration similar to one of the configurations shown in FIGS. 11 to 14, FIGS. 20 and 21, and FIGS. 22 and 23.

(Conveyance Operation)

A conveyance operation performed by the conveyance units 61_1 to 61_4 is described hereinafter in detail with reference to FIGS. 24 to 34.

Figure 24:
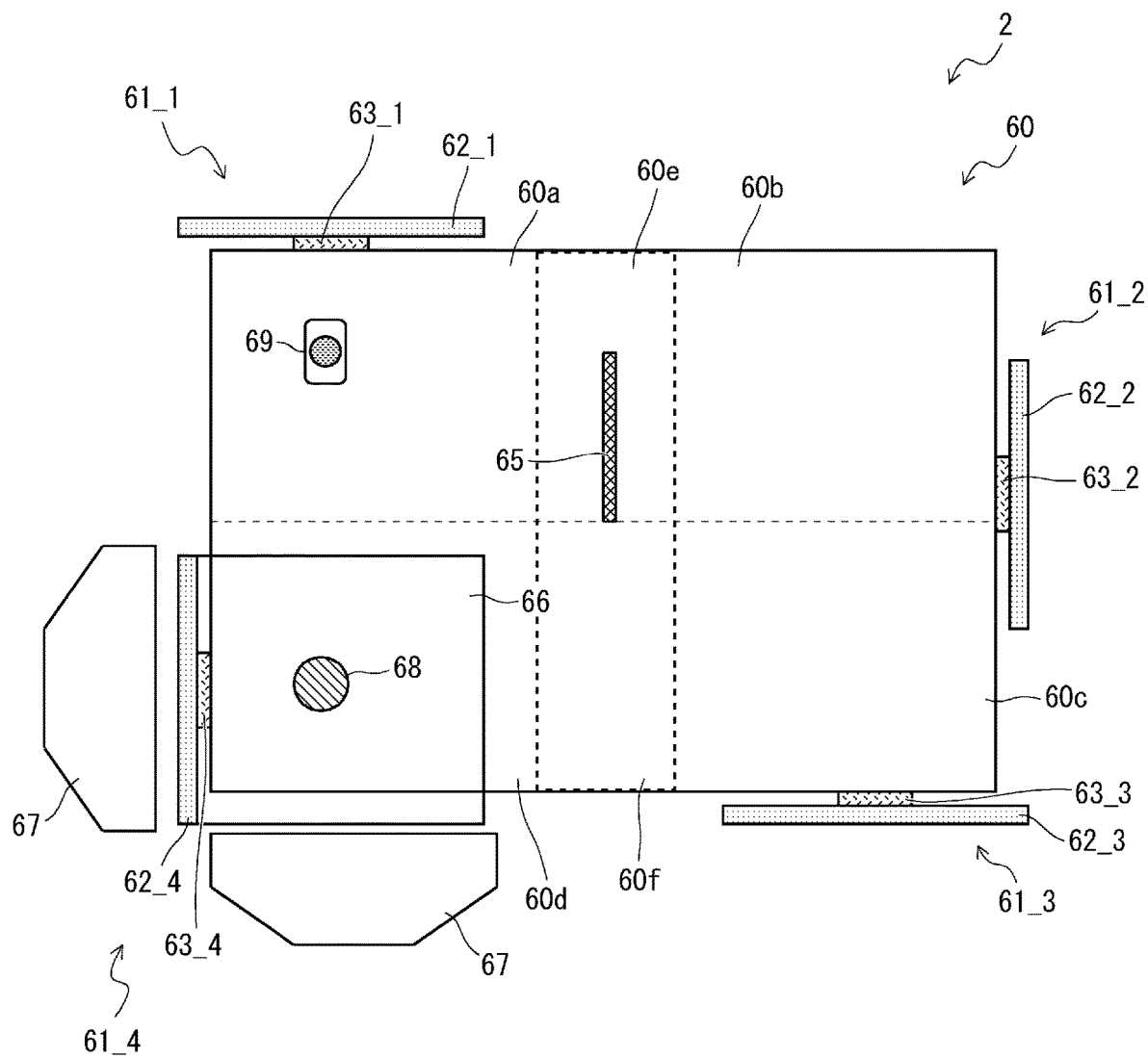
FIG. 24 is a plan view showing a conveyance operation of the laser irradiation apparatus 2 according to the second embodiment.

When laser light 65 is applied to an object to be processed 66 by using the laser irradiation apparatus 2, firstly, the object to be processed 66 is carried in the fourth area 60d as shown in FIG. 24. For example, a conveyance robot (not shown) carries the object to be processed 66 in the fourth area 60d.

Figure 25:
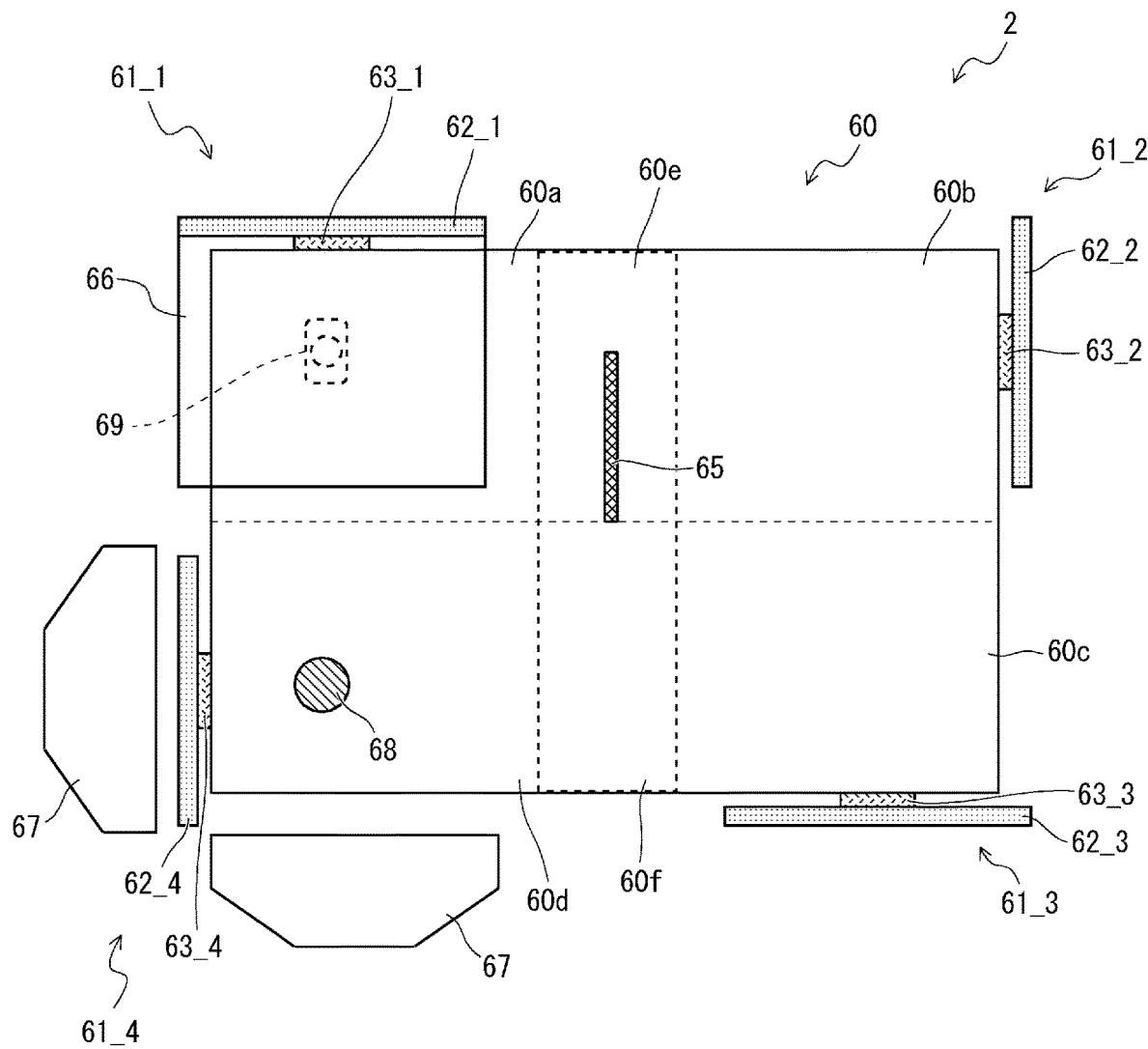
FIG. 25 is a plan view showing the conveyance operation of the laser irradiation apparatus 2 according to the second embodiment.

Next, the bottom surface at an end part of the object to be processed 66 on the x-direction negative side is held by the holding mechanism 62_4 of the conveyance unit 61_4. After that, in the state where the holding mechanism 62_4 holds the object to be processed 66, the object to be processed 66 is conveyed toward the y-direction positive side by moving the moving mechanism 63_4 of the conveyance unit 61_4 toward the y-direction positive side. As a result, the object to be processed 66 moves to the first area 60a as shown in FIG. 25.

When the object to be processed 66 is moved to the first area 60a, the object to be processed 66 is placed over the alignment mechanism 69. Then, the alignment mechanism 69 aligns the object to be processed 66.

Figure 26:
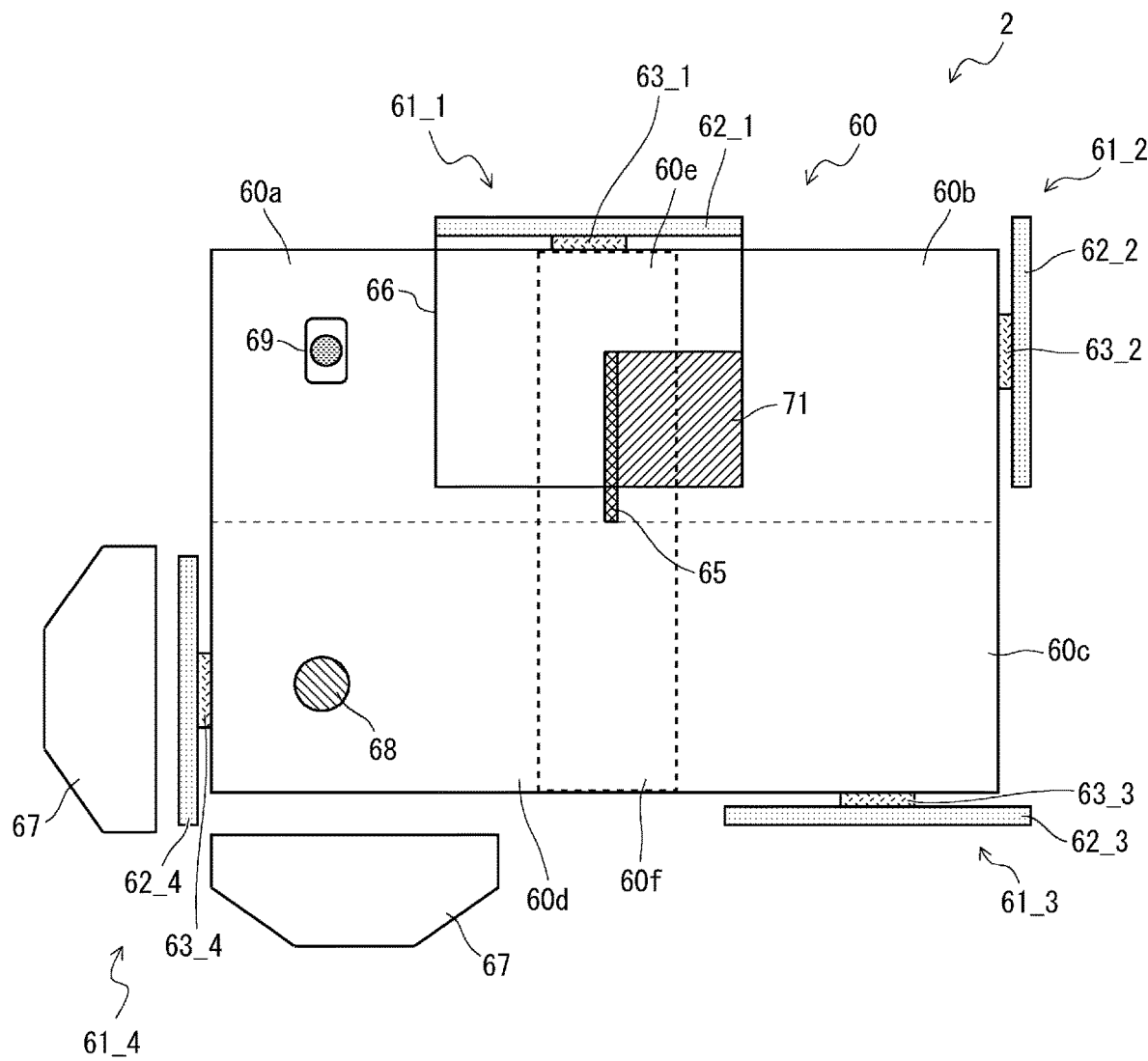
FIG. 26 is a plan view showing the conveyance operation of the laser irradiation apparatus 2 according to the second embodiment.

After the alignment, the bottom surface at an end part of the object to be processed 66 in the y-direction positive side is held by the holding mechanism 62_1 of the conveyance unit 61_1. After that, as shown in FIG. 26, in the state where the holding mechanism 62_1 holds the object to be processed 66, the object to be processed 66 is conveyed toward the x-direction positive side by moving the moving mechanism 63_1 of the conveyance unit 61_1 toward the x-direction positive side. As a result, the object to be processed 66 passes through the irradiation area 60e. Therefore, the laser light 65 is applied to an area on one side on the object to be processed 66, i.e., half of the area on the object to be processed 66 (the area irradiated with the laser light is indicated as a crystallized area 71). In the crystallized area 71, an amorphous film (an amorphous silicon film) is crystallized and a polycrystalline film (a polysilicon film) is formed.

Figure 27:
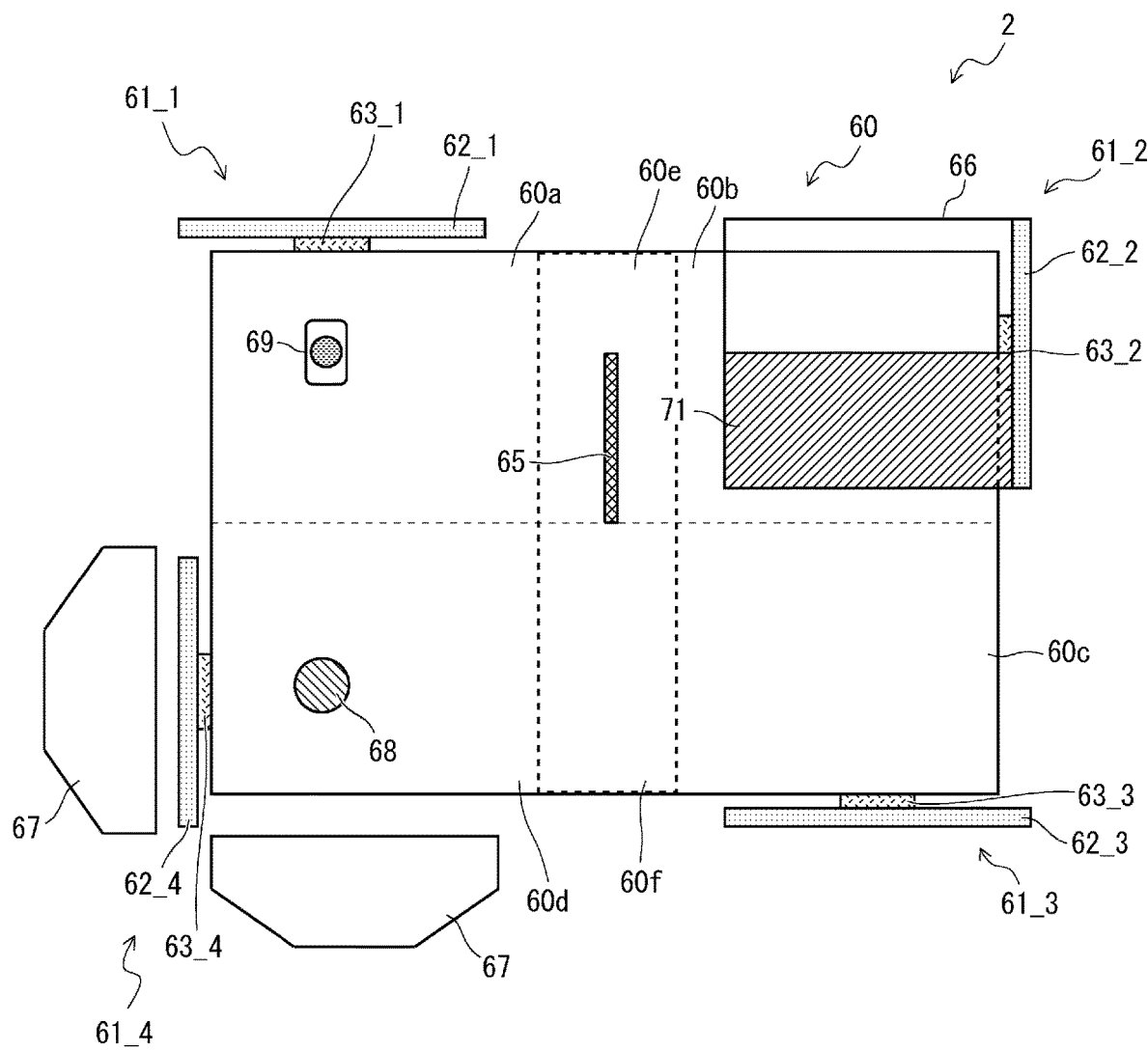
FIG. 27 is a plan view showing the conveyance operation of the laser irradiation apparatus 2 according to the second embodiment.

As shown in FIG. 27, when the object to be processed 66 reaches the second area 60b of the levitation unit 60, the holding mechanism that holds the object to be processed 66 is changed from the holding mechanism 62_1 to the holding mechanism 62_2. Specifically, the holding mechanism 62_1 absorbs the object to be processed 66 and the holding mechanism 62_4 cancels the absorption of the object to be processed 66. That is, the holding mechanisms 62_1 and 62_2 perform a handing-over operation of the object to be processed 66. Further, the conveyance unit 61_1 is returned to the original position (to the first area 60a). In FIG. 27, since the object to be processed 66 had passed through the irradiation area 60e once, substantially half of the object to be processed 66 on the y-direction negative side has become the crystallized area 71. Note that in FIG. 27, the half of the surface of the object to be processed 66 is entirely irradiated with the laser light. However, only a part of the half of the surface of the object to be processed 66 may be irradiated with the laser light.

Figure 28:
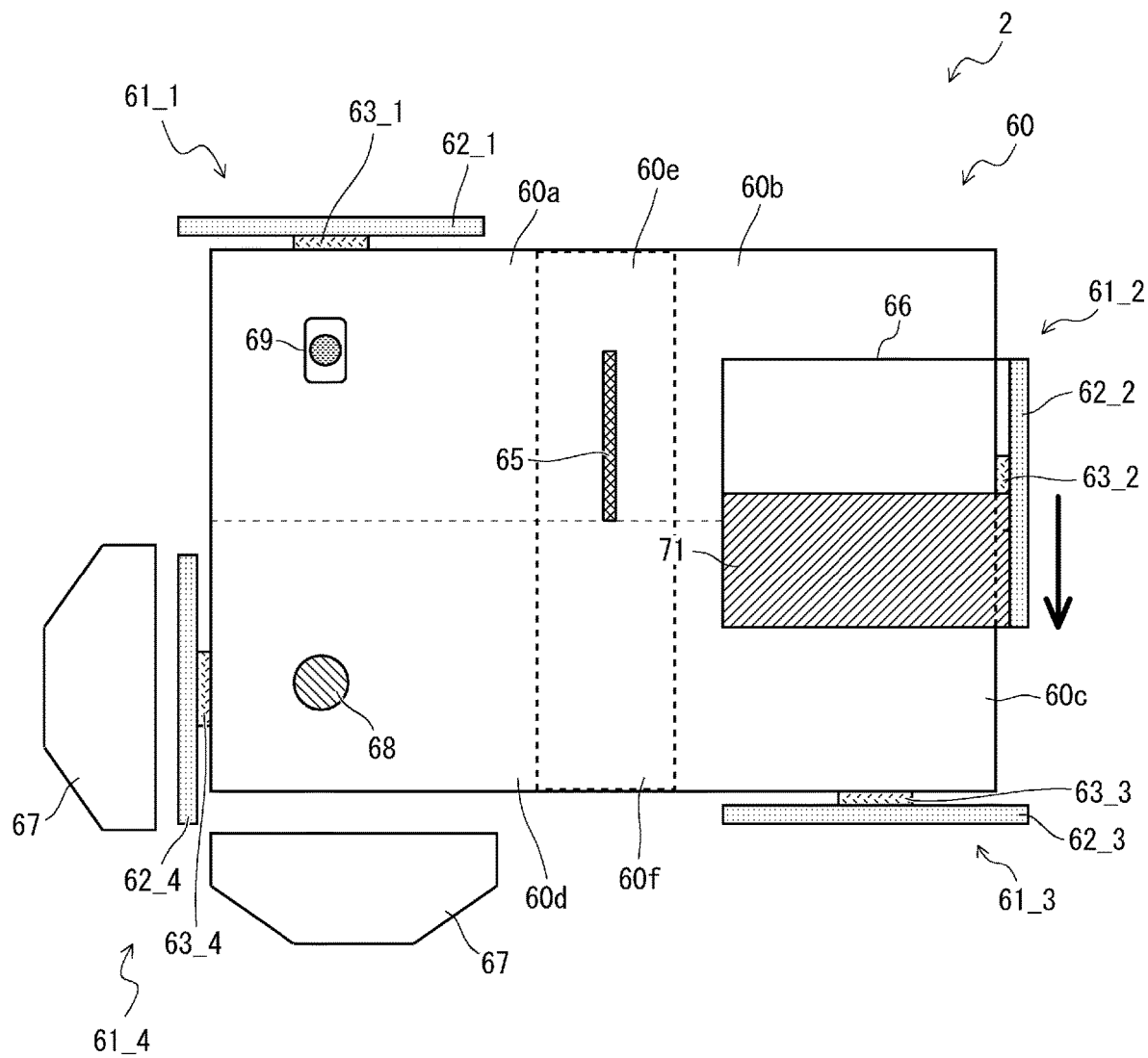
FIG. 28 is a plan view showing the conveyance operation of the laser irradiation apparatus 2 according to the second embodiment.

After that, as shown in FIG. 28, in the state where the holding mechanism 62_2 holds the object to be processed 66, the object to be processed 66 is conveyed toward the y-direction negative side by moving the moving mechanism 63_2 of the conveyance unit 61_2 toward the y-direction negative side.

Figure 29:
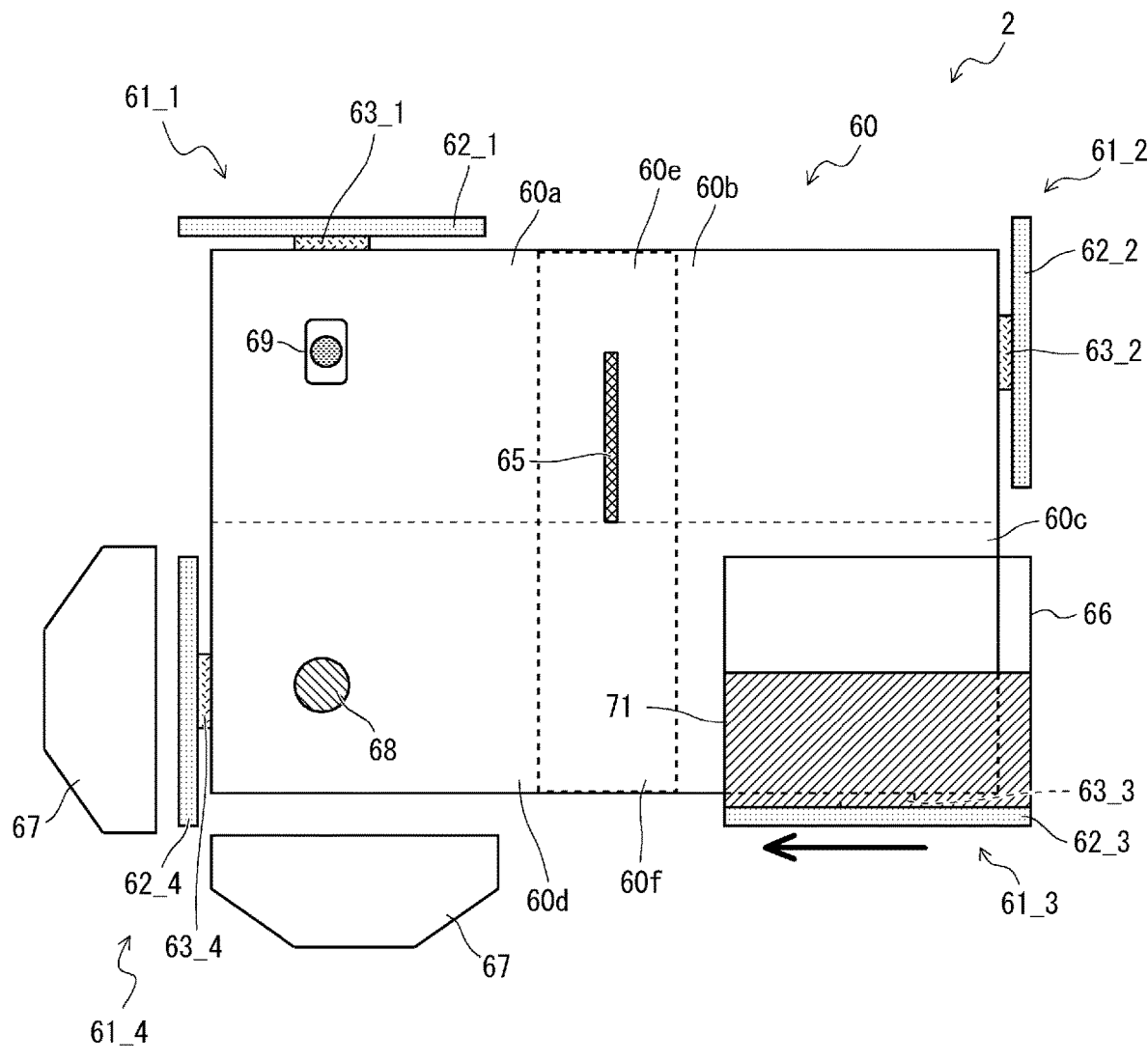
FIG. 29 is a plan view showing the conveyance operation of the laser irradiation apparatus 2 according to the second embodiment.

As shown in FIG. 29, when the object to be processed 66 reaches the third area 60c of the levitation unit 60, the holding mechanism that holds the object to be processed 66 is changed from the holding mechanism 62_2 to the holding mechanism 62_3. That is, the holding mechanisms 62_2 and 62_3 perform a handing-over operation of the object to be processed 66. Further, the conveyance unit 61_2 is returned to the original position (to the second area 60b). After that, in the state where the holding mechanism 62_3 holds the object to be processed 66, the object to be processed 66 is conveyed toward the x-direction negative side by moving the moving mechanism 63_3 of the conveyance unit 61_3 toward the x-direction negative side.

Figure 30:
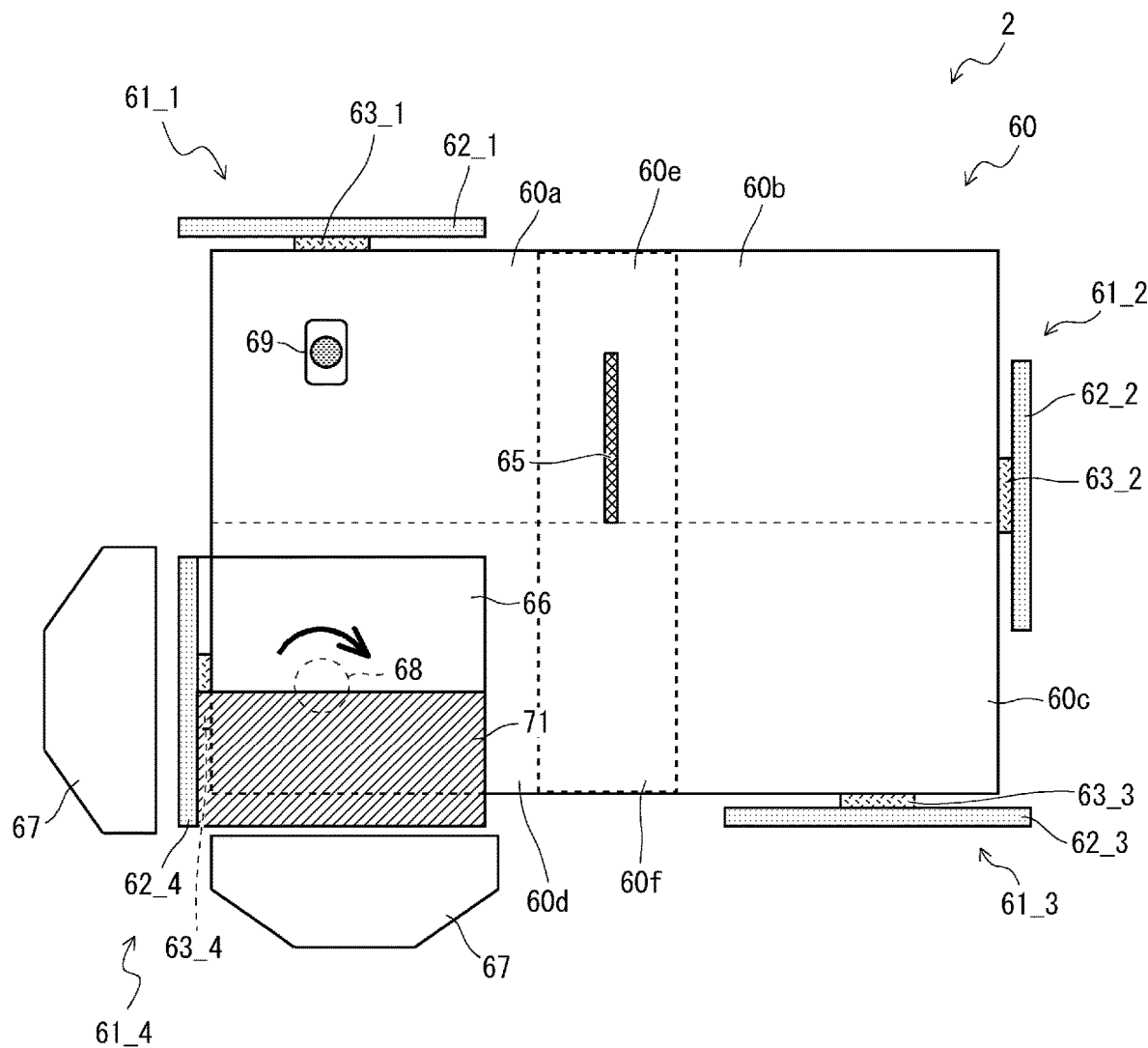
FIG. 30 is a plan view showing the conveyance operation of the laser irradiation apparatus 2 according to the second embodiment.

Then, as shown in FIG. 30, after the object to be processed 66 is conveyed to the fourth area 60d of the levitation unit 60 and reaches a place over the rotation mechanism 68, a handing-over operation from the holding mechanism 62_3 to the rotation mechanism 68 is performed. Specifically, the rotation mechanism 68 holds the object to be processed 66, which is held by the holding mechanism 62_3, through an absorber. Then, the holding state by the holding mechanism 62_3 is cancelled and hence the holding mechanism 62_3 does not hold the object to be processed 66 any longer. After the holding mechanism 62_3 releases the object to be processed 66, the conveyance unit 61_3 returns to the original position (to the fourth area 60d).

Figure 31:
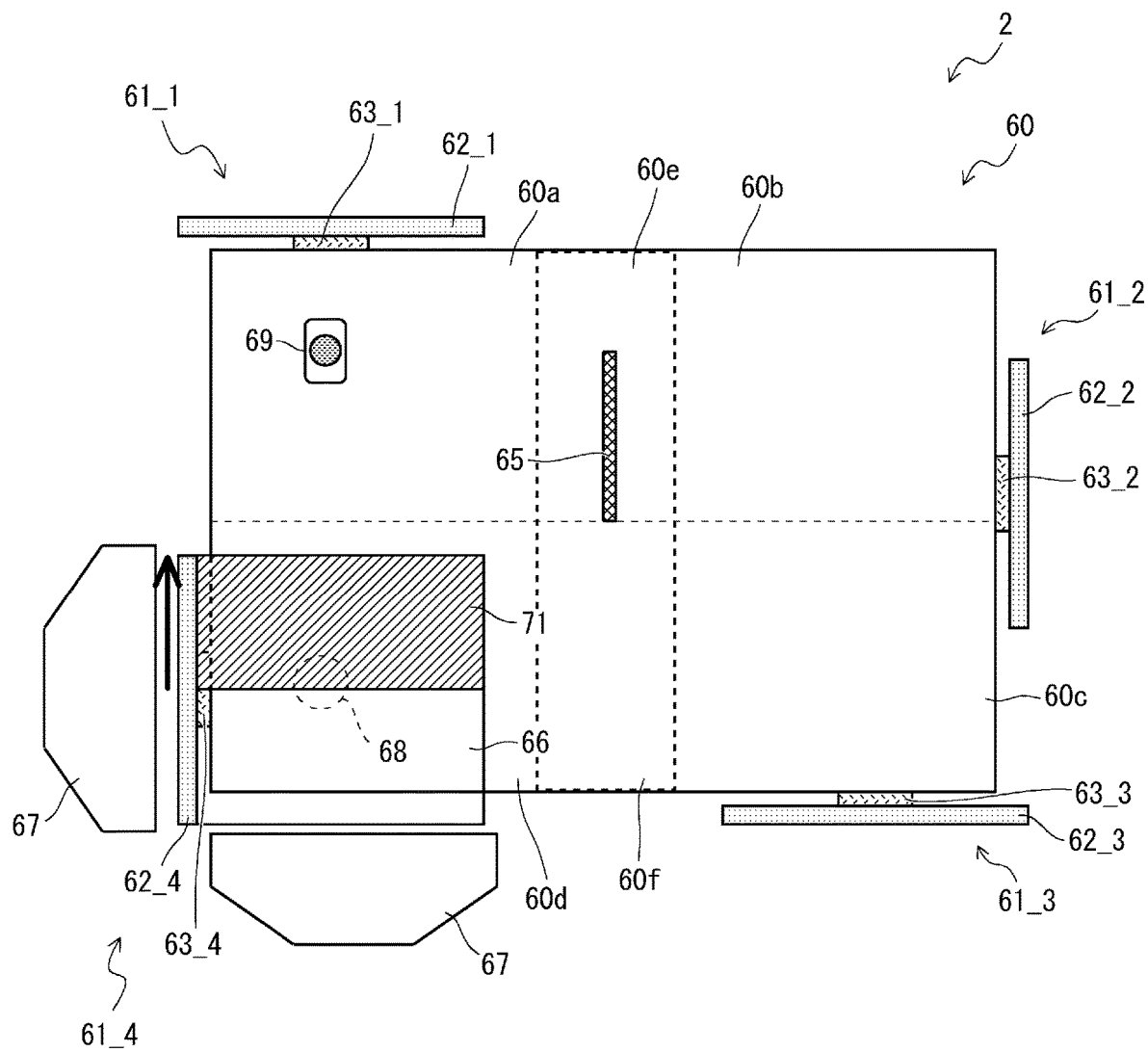
FIG. 31 is a plan view showing the conveyance operation of the laser irradiation apparatus 2 according to the second embodiment.

Then, in the state where the object to be processed 66 is placed over the rotation mechanism 68, the rotation mechanism 68 is rotated by 180 degrees. As a result, the object to be processed 66 is rotated by 180 degrees and, as shown in FIG. 31, the crystallized area 71 of the object to be processed 66 is moved from the y-direction negative side to the y-direction positive side. After that, the holding mechanism 62_4 holds the object to be processed 66. That is, the object to be processed 66 is handed over from the rotation mechanism 68 to the holding mechanism 62_4. Then, in the state where the holding mechanism 62_4 holds the object to be processed 66, the object to be processed 66 is conveyed toward the y-direction positive side by moving the moving mechanism 63_4 of the conveyance unit 61_4 toward the y-direction positive side.

Figure 32:
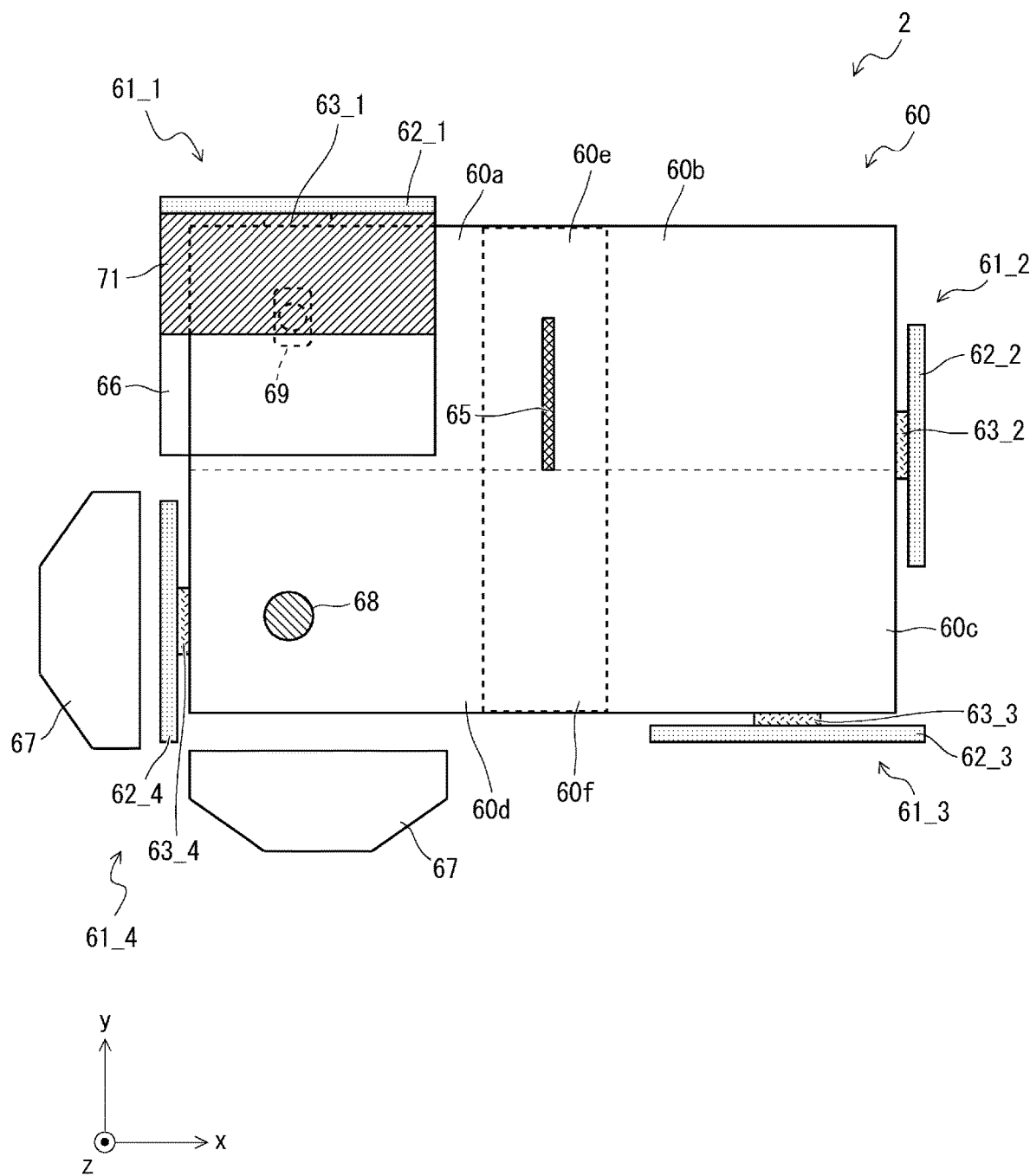
FIG. 32 is a plan view showing the conveyance operation of the laser irradiation apparatus 2 according to the second embodiment.

As shown in FIG. 32, when the object to be processed 66 reaches the first area 60a of the levitation unit 60, the holding mechanism that holds the object to be processed 66 is changed from the holding mechanism 62_4 to the holding mechanism 62_1. Further, the conveyance unit 61_4 is returned to the original position (to the fourth area 60d). Before the holding mechanism 62_1 holds the object to be processed 66 in the position shown in FIG. 32, an alignment operation may be performed by the alignment mechanism 69.

Figure 33:
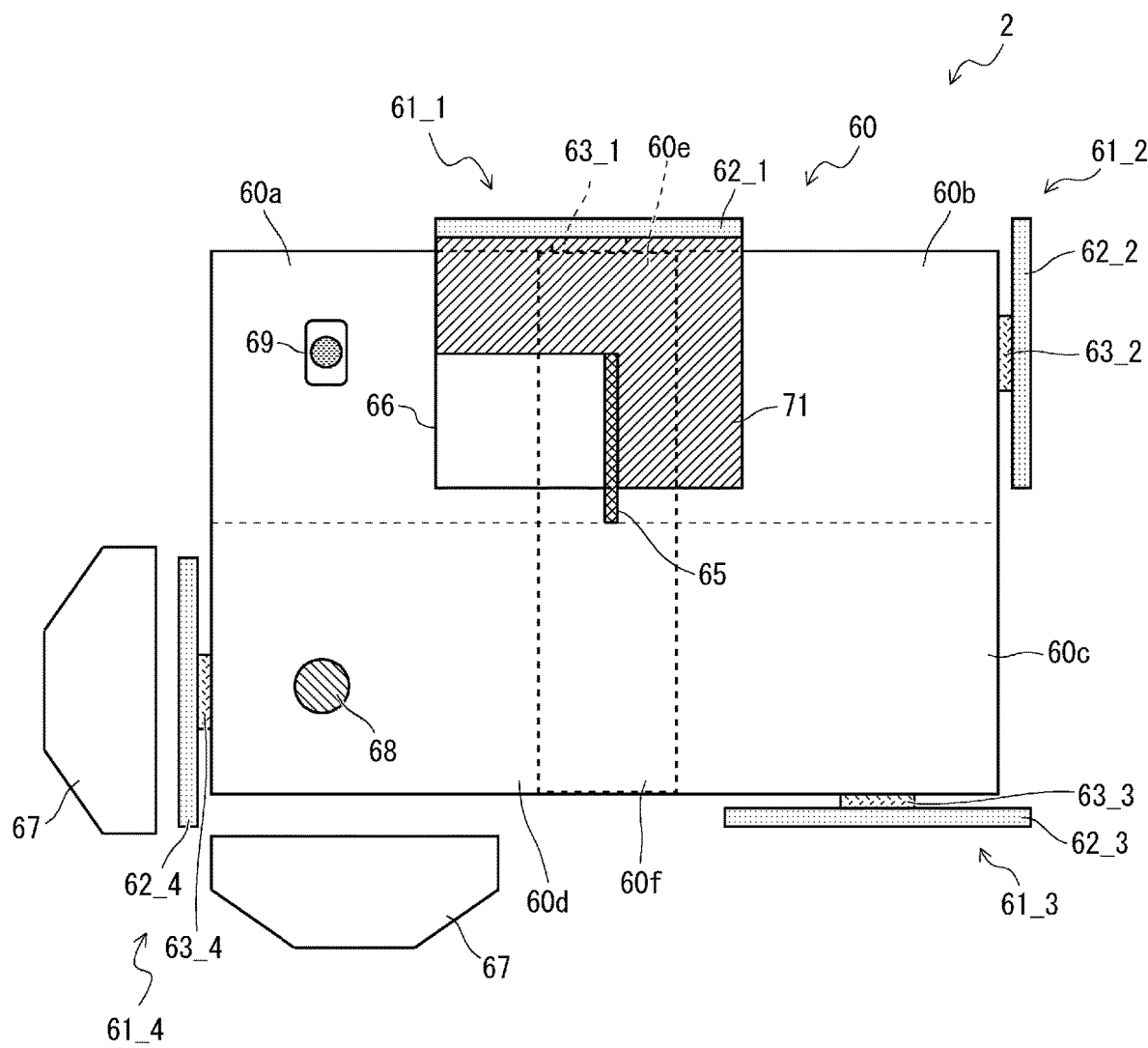
FIG. 33 is a plan view showing the conveyance operation of the laser irradiation apparatus 2 according to the second embodiment.

After that, as shown in FIG. 33, in the state where the holding mechanism 62_1 holds the object to be processed 66, the object to be processed 66 is conveyed toward the x-direction positive side by moving the moving mechanism 63_1 of the conveyance unit 61_1 toward the x-direction positive side. As a result, the object to be processed 66 passes through the irradiation area 60e. The laser light 65 is applied to an area on the other side on the object to be processed 66, i.e., other half of the area on the object to be processed 66. Therefore, the amorphous film on the remaining half of the object to be processed 66 is crystallized and becomes the crystallized area 71.

Figure 34:
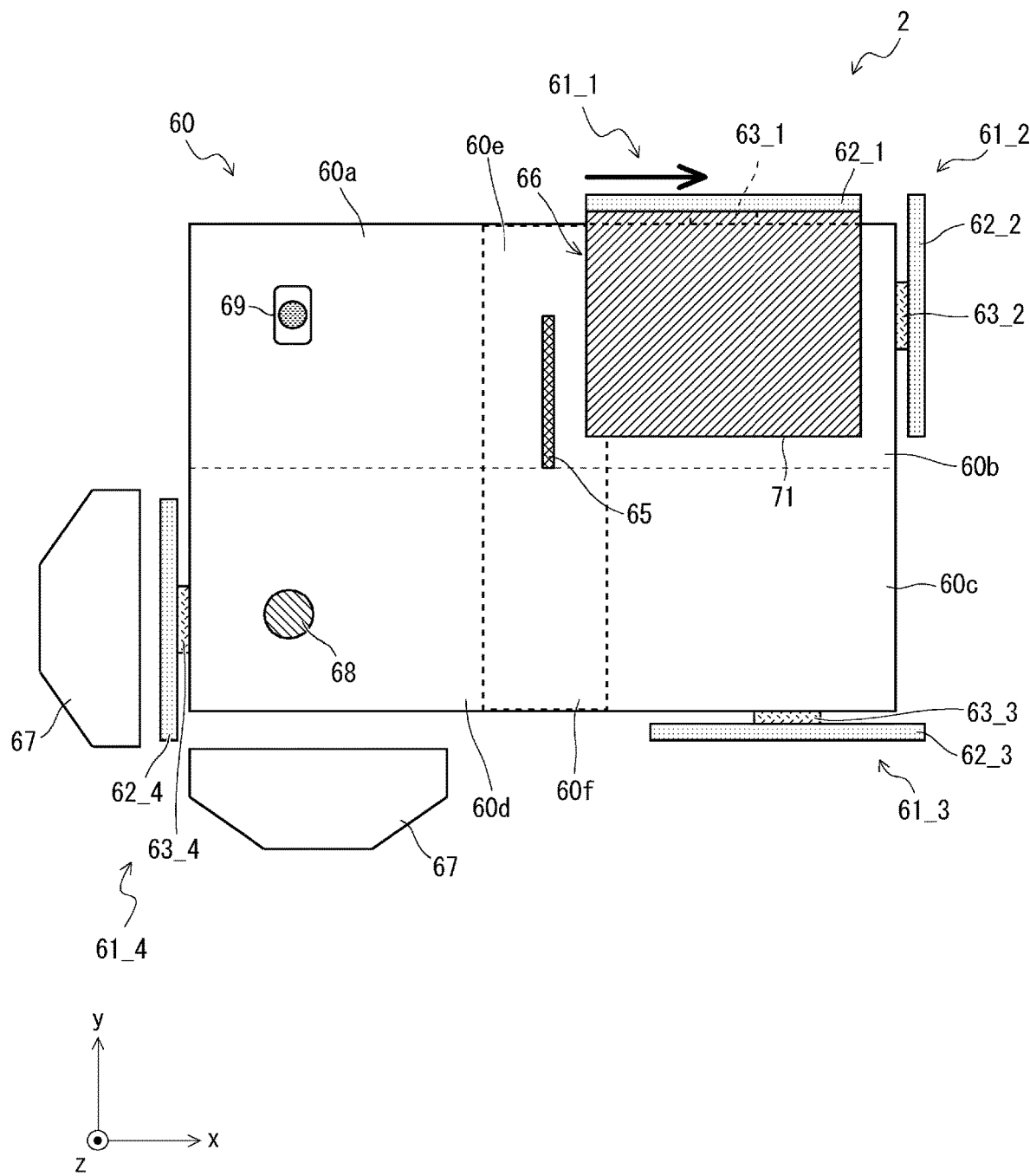
FIG. 34 is a plan view showing the conveyance operation of the laser irradiation apparatus 2 according to the second embodiment.

Then, as shown in FIG. 34, the laser light can be applied to substantially the entire surface of the object to be processed 66 by conveying the object to be processed 66 to the second area 60b. Then, by performing a conveyance operation similar to that in FIGS. 27 to 30, the object to be processed 66 moves to the fourth area 60d.

As described above, in this embodiment, the object to be processed 66 is conveyed so as to circulate over the levitation unit 60 a plurality of times. Note that a conveyance operation in which the object to be processed 66 moves from the fourth area 60d, passes through the first, second and third areas 60a, 60b and 60c, and returns to the fourth area 60d is regarded as one circulative conveyance. It is possible to make the object to be processed 66 pass through the laser irradiation place 65 a plurality of times by repeating the above-described circulative conveyance operation a plurality of times. The laser light is applied to substantially the entire surface of the object to be processed 66 by performing the circulative conveyance twice. Further, the laser light can be applied to the same place on the object to be processed 66 a plurality of times by performing the circulative conveyance three times or more. Then, after performing the circulative conveyance a predetermined number of times, the object to be processed 66 is carried away from the fourth area 60d.

Note that the above-described laser irradiation apparatus 2 is described by using an example in which the rotation mechanism 68 is disposed in the area 60d of the levitation unit 60. However, in this embodiment, the rotation mechanism 68 may be disposed in a place other than the fourth area 60d of the levitation unit 60. That is, all that needs to be performed is to rotate the object to be processed 66 by 180 degrees after the object to be processed 66 passes through the laser irradiation place 65 and before it passes the laser irradiation place 65 again. Therefore, the rotation mechanism 68 may be disposed in any of the first to fourth areas 60a to 60d of the levitation unit.

Further, in the laser irradiation apparatus 2 according to this embodiment, the laser light 65 is applied to the object to be processed 66 by conveying the object to be processed 66 to the fourth area 60d, the first area 60a, the second area 60b, and the third area 60c in this order. Therefore, it is possible to circulate and convey a plurality of objects to be processed 66 at the same time.

That is, in the laser irradiation apparatus 2 according to this embodiment, it is possible to, when laser light 65 is applied to one object to be processed 66, convey another object to be processed 66, rotate another object to be processed by the rotation mechanism 68, and/or carry in/away another object to be processed 66. Therefore, it is possible to apply laser light 65 to one object to be processed 66 and, immediately after that, apply laser light 65 to another object to be processed 66. Therefore, it is possible to reduce the time during which the laser light 65 is not applied to any object to be processed. That is, in this embodiment, it is possible to improve throughput of the laser irradiation apparatus 2. Note that in this case, the rotation mechanism 68 is preferably disposed in an area other than the first and second areas 60a and 60b. For example, the rotation mechanism 68 is preferably disposed in the fourth area 60d.

Other Embodiments

Next, as other embodiments, a method for manufacturing a semiconductor device by using the above-described laser irradiation apparatus is described. In this embodiment, by using a laser annealing apparatus as the laser irradiation apparatus, it is possible to crystallize an amorphous film formed over a substrate by applying laser light to the amorphous film. For example, the semiconductor device is a semiconductor device including TFTs (Thin Film Transistors). In this case, it is possible to form a polysilicon film by applying laser light to an amorphous silicon film and thereby crystallizing the amorphous silicon film.
(Method for Manufacturing Semiconductor Device)

Figure 35:
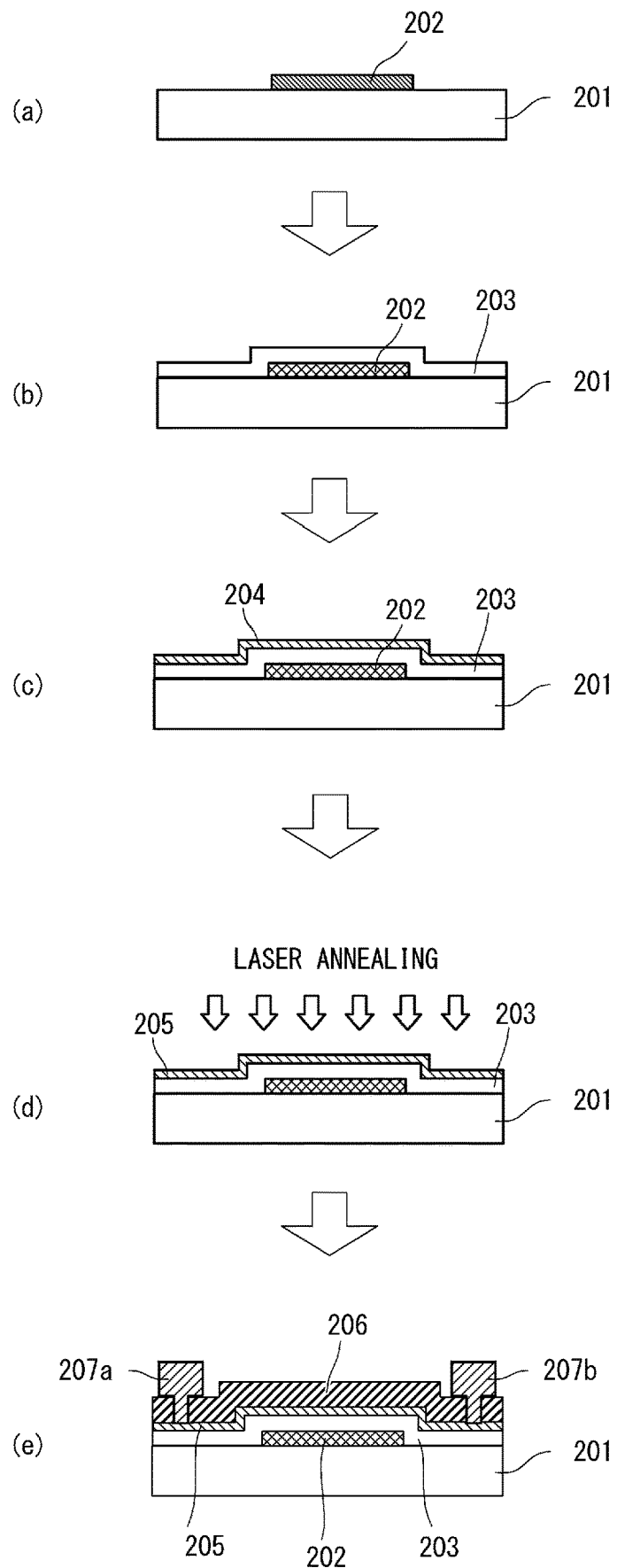
FIG. 35 shows cross sections showing steps showing a method for manufacturing TFTs.

FIG. 35 is a cross section for explaining an example of a method for manufacturing a semiconductor device. The laser irradiation apparatus according to the above-described embodiment is suitable for manufacturing a TFT array substrate. A method for manufacturing a semiconductor device including a TFT is described hereinafter.

Firstly, as shown in FIG. 35(a), a gate electrode 202 is formed over a glass substrate 201. For example, a metal thin film containing aluminum or the like can be used for the gate electrode 202. Next, as shown in FIG. 35(b), a gate insulating film 203 is formed over the gate electrode 202. The gate insulating film 203 is formed so as to cover the gate electrode 202. After that, as shown in FIG. 35(c), an amorphous silicon film 204 is formed over the gate insulating film 203. The amorphous silicon film 204 is disposed so as to be placed over the gate electrode 202 with the gate insulating film 203 interposed therebetween.

The gate insulating film 203 is, for example, a silicon nitride film ($SiN_x$), a silicon oxide film ($SiO_2$ film), or a laminated film thereof. Specifically, the gate insulating film 203 and the amorphous silicon film 204 are successively formed by a CVD (Chemical Vapor Deposition) method. The glass substrate 201 with the amorphous silicon film 204 deposited thereon is the object to be processed 16 or 66 in the laser irradiation apparatus 1 or 2.

Then, as shown in FIG. 35(d), a polysilicon film 205 is formed by applying laser light to the amorphous silicon film 204 by using the above-described laser irradiation apparatus and thereby crystallizing the amorphous silicon film 204. As a result, the polysilicon film 205 in which silicon is crystallized is formed over the gate insulating film 203.

Note that it is possible to, when laser is applied to the glass substrate 201, reduce the effect of warping thereof by using the laser irradiation apparatus according to the above-described embodiment. Therefore, it is possible to prevent the amorphous silicon film 204 from being displaced from the depth of field (DOF) of the laser light applied thereto. Therefore, it is possible to form a uniformly-crystallized polysilicon film 205.

After that, as shown in FIG. 35(e), an inter-layer insulating film 206, a source electrode 207a, and a drain electrode 207b are formed over the polysilicon film 205. The inter-layer insulating film 206, the source electrode 207a, and the drain electrode 207b can be formed by an ordinary photo-lithography method or an ordinary film forming method.

It is possible to manufacture a semiconductor device including TFTs by using the above-described method for manufacturing a semiconductor device. Note that the subsequent manufacturing process will vary depending on the device that is eventually manufactured, and therefore its description is omitted.
(Organic EL Display)

Figure 36:
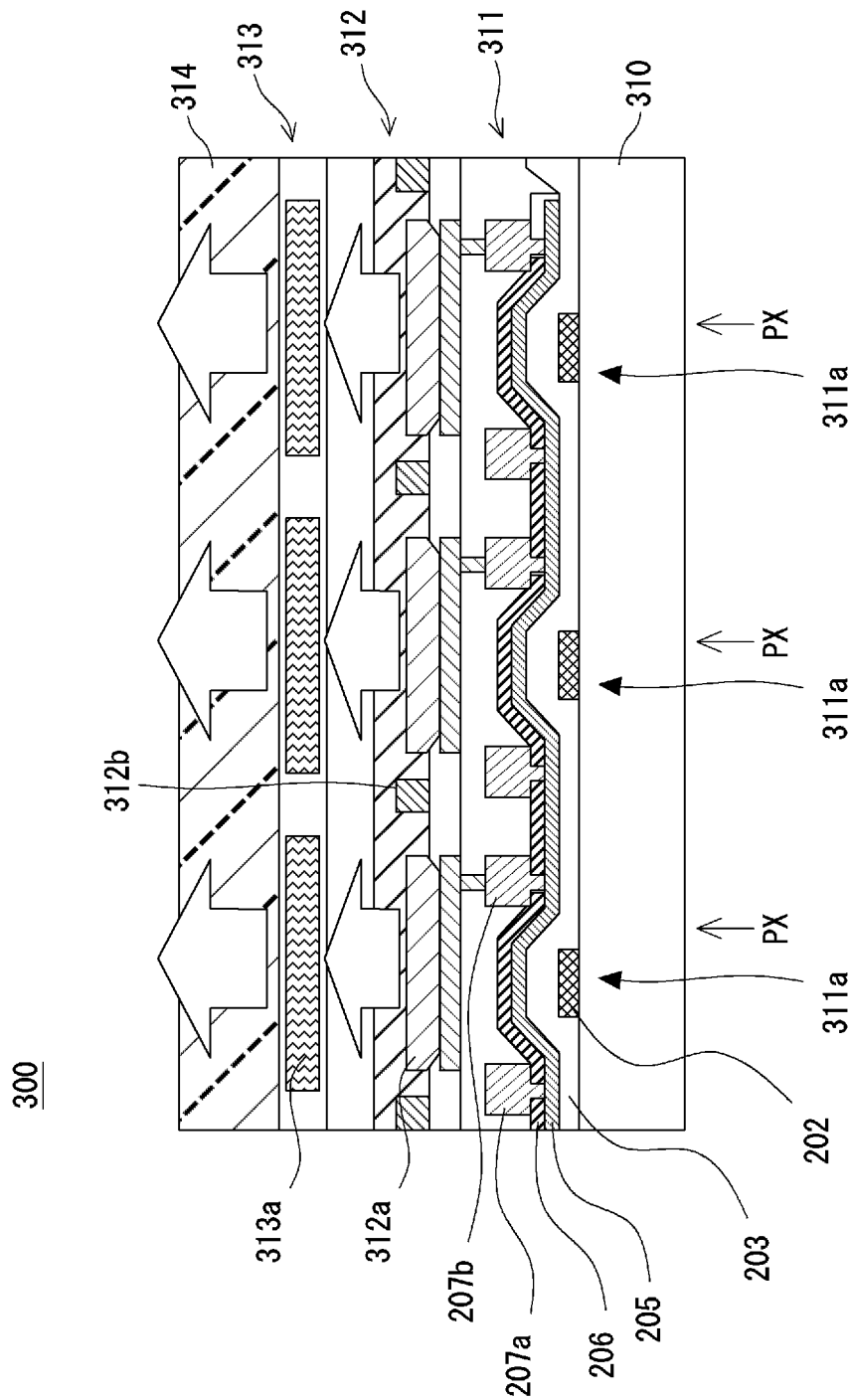
FIG. 36 is a cross section of an organic EL display 300.

Next, as an example of a device using a semiconductor device including TFTs, an organic EL display device is described. FIG. 36 is a cross section for explaining an outline of an organic EL display device, in which pixel circuits of the organic EL display device are illustrated in a simplified manner. The organic EL display device 300 shown in FIG. 36 is an active-matrix-type display device in which a TFT is disposed in each pixel Px.

The organic EL display device 300 includes a substrate 310, a TFT layer 311, an organic layer 312, a color filter layer 313, and a sealing substrate 314. FIG. 36 shows a top-emission-type organic EL display device, in which the side of the sealing substrate 314 is located on the viewing side. Note that the following description is given to show an example of a configuration of an organic EL display device and this embodiment is not limited to the below-described configuration. For example, a semiconductor device according to this embodiment may be used for a bottom-emission-type organic EL display device.

The substrate 310 is a glass substrate or a metal substrate. The TFT layer 311 is provided over the substrate 310. The TFT layer 311 includes TFTs 311a disposed in the respective pixels Px. Further, the TFT layer 311 includes wiring lines connected to the TFTs 311a, and the like. The TFTs 311a, the wirings, and the like constitute pixel circuits. Note that the TFT layer 311 corresponds to the TFT described above with reference to FIG. 35, and includes gate electrodes 202, a gate insulating film 203, a polysilicon film 205, an inter-layer insulating film 206, source electrodes 207a, and drain electrodes 207b.

The organic layer 312 is provided over the TFT layer 311. The organic layer 312 includes an organic EL light-emitting element 312a disposed in each pixel Px. The organic EL light-emitting element 312a has, for example, a laminated configuration in which an anode, a hole injection layer, a hole transport layer, a light-emitting layer, an electron transport layer, an electron injection layer, and a cathode are laminated. In the case of the top emission type, the anode is a metal electrode and the cathode is a transparent conductive film made of ITO (Indium Tin Oxide) or the like. Further, in the organic layer 312, separation walls 312b for separating organic EL light-emitting elements 312a are provided between pixels Px.

The color filter layer 313 is provided over the organic layer 312. The color filter layer 313 includes color filters 313a for performing color displaying. That is, in each pixel PX, a resin layer colored in R (red), G (green), or B (blue) is provided as the color filter 313a. When white light emitted from the organic layer 312 passes through the color filters 313a, the white light is converted into light having RGB colors. Note that in the case of a three-color system in which organic EL light-emitting elements capable of emitting each color of RGB are provided in the organic layer 312, the color filter layer 313 may be unnecessary.

The sealing substrate 314 is provided over the color filter layer 313. The sealing substrate 314 is a transparent substrate such as an insulating and transparent glass substrate and is provided to prevent deterioration of the organic EL light-emitting elements of the organic layer 312.

Electric currents flowing through the organic EL light-emitting elements 312a of the organic layer 312 are changed by display signals supplied to the pixel circuits. Therefore, it is possible to control an amount of light emitted in each pixel Px by supplying a display signal corresponding to a display image to each pixel Px. As a result, it is possible to display a desired image.

Note that although the organic EL display device has been described above as an example of a device using a semiconductor device including TFTs, the semiconductor device including TFTs may be other types of display devices such as a liquid crystal display device. Further, cases where the laser irradiation apparatus according to this embodiment is applied to a laser annealing apparatus have been described above. However, the laser irradiation apparatus according to this embodiment can also be applied to apparatuses other than the laser annealing apparatus.

The present invention made by the inventors of the present application has been explained above in a concrete manner based on embodiments. However, the present invention is not limited to the above-described embodiments, and needless to say, various modifications can be made without departing from the spirit and scope of the present invention.

This application is based upon and claims the benefit of priority from Japanese patent application No. 2017-050811, filed on Mar. 16, 2017, the disclosure of which is incorporated herein in its entirety by reference.

REFERENCE SIGNS LIST

1 LASER IRRADIATION DEVICE
10 LEVITATION UNIT
11 CONVEYANCE UNIT
12 HOLDING MECHANISM
13 MOVING MECHANISM
14 LASER GENERATION APPARATUS
15 LASER LIGHT, LASER IRRADIATION PLACE
16 OBJECT TO BE PROCESSED
2 LASER IRRADIATION APPARATUS
60 LEVITATION UNIT
61_1 to 61_4 CONVEYANCE UNIT
62_1 to 62_4 HOLDING MECHANISM
63_1 to 63_4 MOVING MECHANISM
60A FIRST AREA
60B SECOND AREA
60C THIRD AREA
60D FOURTH AREA
60E IRRADIATION AREA
60F MONITORING AREA
65 LASER LIGHT
66 OBJECT TO BE PROCESSED
67 AUXILIARY LEVITATION UNIT
68 ROTATION MECHANISM
69 ALIGNMENT MECHANISM
143 VALVE
144 VACUUM GENERATION DEVICE
145 PIPE
147 PIPE
149 PRESSURE GAUGE
150 ABSORPTION ASSISTANCE VALVE
152 THROUGH HOLE
152a, 152b THROUGH HOLE
152c SPACE
153 BASE
153a TOP SURFACE
153b BOTTOM SURFACE
154 GROOVE

The invention claimed is:
1. A laser irradiation apparatus comprising:
a laser generation device configured to generate laser light;
a levitation unit configured to levitate an object to be processed to which the laser light is applied; and
a conveyance unit configured to convey the levitated object to be processed,
wherein
the conveyance unit comprises:
a holding mechanism for holding the object to be processed by absorbing the object to be processed; and
a moving mechanism for moving the holding mechanism in a conveyance direction, and
the holding mechanism comprises:
a base including: a first surface serving as an absorption surface on which the object to be processed is absorbed; a second surface opposite to the first surface; and a plurality of through holes extending from the first surface to the second surface;
a plurality of pipes each of which is connected to a respective one of the plurality of through holes on the second surface of the base;
an evacuation mechanism for evacuating air from the plurality of pipes; and
a plurality of absorption assistance valves each of which is disposed in the middle of a respective one of the plurality of pipes, each of the plurality of absorption assistance valves being configured to be closed when a flow rate of a gas flowing into the pipe through the through hole becomes equal to or higher than a threshold,
wherein
the first surface of the base is divided into a plurality of divided first surfaces, and
the through hole is provided on each of the plurality of divided first surfaces, and wherein
the first surface of the base is divided along the conveyance direction of the conveyance unit.

2. The laser irradiation apparatus according to claim 1, wherein the first surface of the base is divided along a direction perpendicular to the conveyance direction of the conveyance unit.

3. The laser irradiation apparatus according to claim 1, wherein the through holes include:
a first through hole opened on the first surface; and
a second through hole connected to the first through hole and connected to the pipe on the second surface, and
a diameter of the second through hole is larger than that of the first through hole.

4. The laser irradiation apparatus according to claim 3, wherein
the through holes include a plurality of first through holes, and
the second through hole is connected to the plurality of first through holes.

5. The laser irradiation apparatus according to claim 1, wherein a groove is formed on each of the plurality of divided first surfaces.

6. The laser irradiation apparatus according to claim 5, wherein the grooves formed on the respective divided first surfaces are connected to one another.

7. The laser irradiation apparatus according to claim 6, wherein the through hole is opened in a place where the groove is formed on each of the plurality of divided first surfaces.

8. The laser irradiation apparatus according to claim 1, wherein the holding mechanism comprises:
a pressure gauge configured to measure a pressure inside one of the plurality of pipes; and
a determination unit configured to determine whether or not the object to be processed is absorbed based on the pressure measured by the pressure gauge.

9. The laser irradiation apparatus according to claim 1, wherein
the levitation unit includes first to fourth areas to which the object to be processed is conveyed,
the conveyance unit comprises:
a first conveyance unit configured to convey the object to be processed from the first area to the second area;
a second conveyance unit configured to convey the object to be processed from the second area to the third area;
a third conveyance unit configured to convey the object to be processed from the third area to the fourth area; and
a fourth conveyance unit configured to convey the object to be processed from the fourth area to the first area;
the laser light is applied to the object to be processed when the object to be processed is conveyed from the first area to the second area, and
a length of the first holding mechanism of the first conveyance unit in a direction perpendicular to a first conveyance direction of the first conveyance unit is shorter than a length of the second holding mechanism of the second conveyance unit in a direction perpendicular to a second conveyance direction of the second conveyance unit and a length of the fourth holding mechanism of the fourth conveyance unit in a direction perpendicular to a fourth conveyance direction of the fourth conveyance unit.

10. The laser irradiation apparatus according to claim 1, wherein the base is made of aluminum.

11. A laser irradiation method for applying laser light to an object to be processed by conveying the object to be processed using a conveyance unit while levitating the object to be processed using a levitation unit, comprising:
(a) holding, by a holding mechanism, the object to be processed by absorbing the object to be processed;
(b) conveying, by a moving mechanism, the object to be processed by moving the holding mechanism holding the object to be processed; and
(c) applying the laser light to the object to be processed while the moving mechanism is moving the holding mechanism, wherein
the holding mechanism comprises:
a base including: a first surface serving as an absorption surface on which the object to be processed is absorbed; a second surface opposite to the first surface; and a plurality of through holes extending from the first surface to the second surface; the first surface of the base being divided along the conveyance direction of the conveyance unit into a plurality of divided first surfaces, and the through hole being provided on each of the plurality of divided first surfaces;
a plurality of pipes each of which is connected to a respective one of the plurality of through holes on the second surface of the base;
an evacuation mechanism for evacuating air from the plurality of pipes; and
a plurality of absorption assistance valves each of which is disposed in the middle of a respective one of the plurality of pipes, each of the plurality of absorption assistance valves being configured to be closed when a flow rate of a gas flowing into the pipe through the through hole becomes equal to or higher than a threshold.

12. A method for manufacturing a semiconductor device, comprising the steps of:
(A) forming an amorphous film over a substrate; and
(B) crystallizing the amorphous film by applying laser light to the amorphous film, wherein
the step (B) is a step of applying the laser light to the amorphous film by conveying the substrate using a conveyance unit while levitating the substrate using a levitation unit, and comprises:
(a) holding, by a holding mechanism, the substrate by absorbing the substrate;
(b) conveying, by a moving mechanism, the substrate by moving the holding mechanism holding the substrate; and
(c) applying the laser light to the substrate while the moving mechanism is moving the holding mechanism, and
the holding mechanism comprises:
a base including: a first surface serving as an absorption surface on which the substrate is absorbed; a second surface opposite to the first surface; and a plurality of through holes extending from the first surface to the second surface; the first surface of the base being divided along the conveyance direction of the conveyance unit into a plurality of divided first surfaces, and the through hole being provided on each of the plurality of divided first surfaces;
a plurality of pipes each of which is connected to a respective one of the plurality of through holes on the second surface of the base;
an evacuation mechanism for evacuating air from the plurality of pipes; and
a plurality of absorption assistance valves each of which is disposed in the middle of a respective one of the plurality of pipes, each of the plurality of absorption assistance valves being configured to be closed when a flow rate of a gas flowing into the pipe through the through hole becomes equal to or higher than a threshold.

* * * * *